United States Patent
Luo et al.

(10) Patent No.: US 9,449,917 B2
(45) Date of Patent: Sep. 20, 2016

(54) METHOD OF FORMING AN INDUCTOR WITH MAGNETIC MATERIAL

(71) Applicant: Taiwan Semiconductor Manufacturing Company, Ltd., Hsin-Chu (TW)

(72) Inventors: Cheng-Wei Luo, Hsin-Chu (TW); Hsiao-Tsung Yen, Tainan (TW); Chin-Wei Kuo, Zhubei (TW); Min-Chie Jeng, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/720,805

(22) Filed: May 24, 2015

(65) Prior Publication Data
US 2015/0255391 A1 Sep. 10, 2015

Related U.S. Application Data

(62) Division of application No. 13/935,238, filed on Jul. 3, 2013, now Pat. No. 9,041,152.

(60) Provisional application No. 61/783,735, filed on Mar. 14, 2013.

(51) Int. Cl.
| | |
|---|---|
| *H01L 29/00* | (2006.01) |
| *H01L 23/522* | (2006.01) |
| *H01L 21/48* | (2006.01) |
| *H01L 23/14* | (2006.01) |
| *H01L 23/498* | (2006.01) |

(Continued)

(52) U.S. Cl.
CPC ....... *H01L 23/5227* (2013.01); *H01F 17/0033* (2013.01); *H01L 21/486* (2013.01); *H01L 23/147* (2013.01); *H01L 23/49822* (2013.01); *H01L 23/5384* (2013.01); *H01L 28/10* (2013.01); *H01F 2017/0066* (2013.01); *H01F 2017/0086* (2013.01); *H01F 2027/2809* (2013.01); *H01L 23/49816* (2013.01); *H01L 2224/16225* (2013.01); *H01L 2924/13091* (2013.01); *H01L 2924/15311* (2013.01)

(58) Field of Classification Search
CPC ............... H01L 29/00; H01L 23/5227; H01L 2924/48091; H01L 2924/13011; H01H 23/645
USPC ........................................................ 257/531
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |

(Continued)

*Primary Examiner* — Phuc Dang
(74) *Attorney, Agent, or Firm* — Slater Matsil, LLP

(57) ABSTRACT

In accordance with an embodiment, a semiconductor device comprises a semiconductor die, an interposer, and conductive bumps bonding the semiconductor die to the interposer. The semiconductor die comprises a first metallization layer, and the first metallization layer comprises a first conductive pattern. The interposer comprises a second metallization layer, and the second metallization layer comprises a second conductive pattern. Some of the conductive bumps electrically couple the first conductive pattern to the second conductive pattern to form a coil. A magnetic layer is positioned within the coil. In another embodiment, a coil is formed on a single substrate, wherein a magnetic layer is positioned within the coil. Other embodiments contemplate other configurations of coils, inductors, and/or transformers, and contemplate methods of manufacture.

20 Claims, 24 Drawing Sheets

(51) Int. Cl.
  *H01L 23/538* (2006.01)
  *H01F 17/00* (2006.01)
  *H01L 49/02* (2006.01)
  *H01F 27/28* (2006.01)

(56) References Cited

U.S. PATENT DOCUMENTS

| | | |
|---|---|---|
| 5,541,135 A | 7/1996 | Pfeifer et al. |
| 5,767,001 A | 6/1998 | Bertagnolli et al. |
| 5,998,292 A | 12/1999 | Black et al. |
| 6,008,102 A | 12/1999 | Alford et al. |
| 6,184,060 B1 | 2/2001 | Siniaguine |
| 6,322,903 B1 | 11/2001 | Siniaguine et al. |
| 6,417,754 B1 | 7/2002 | Bernhardt et al. |
| 6,445,271 B1 | 9/2002 | Johnson |
| 6,448,168 B1 | 9/2002 | Rao et al. |
| 6,465,892 B1 | 10/2002 | Suga |
| 6,472,293 B1 | 10/2002 | Suga |
| 6,480,086 B1 | 11/2002 | Kluge et al. |
| 6,498,557 B2 | 12/2002 | Johnson |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,744,114 B2 | 6/2004 | Dentry et al. |
| 6,798,327 B2 | 9/2004 | Yu et al. |
| 6,800,533 B1 | 10/2004 | Yeo et al. |
| 6,800,930 B2 | 10/2004 | Jackson et al. |
| 6,841,883 B1 | 1/2005 | Farnworth et al. |
| 6,878,633 B2 | 4/2005 | Raskin et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,164,339 B2 | 1/2007 | Huang |
| 7,170,384 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,354,798 B2 | 4/2008 | Pogge et al. |
| 7,355,273 B2 | 4/2008 | Jackson et al. |
| 7,518,248 B2 | 4/2009 | Li et al. |
| 7,843,303 B2 | 11/2010 | Lu et al. |
| 7,932,590 B2 | 4/2011 | Lam |
| 7,990,220 B2 | 8/2011 | Kondo et al. |
| 8,314,496 B2 | 11/2012 | Chen |
| 8,416,047 B2 | 4/2013 | Weekamp et al. |
| 8,471,358 B2 | 6/2013 | Yen et al. |
| 8,598,715 B2 | 12/2013 | Chen |
| 2006/0267216 A1 | 11/2006 | Li et al. |
| 2008/0054428 A1 | 3/2008 | Lam |
| 2008/0061418 A1 | 3/2008 | Enquist et al. |
| 2008/0197491 A1 | 8/2008 | Matsui |
| 2009/0090995 A1 | 4/2009 | Yang et al. |
| 2009/0243035 A1 | 10/2009 | Mashino |
| 2010/0109133 A1 | 5/2010 | Ito et al. |
| 2010/0117737 A1 | 5/2010 | Kondo et al. |
| 2010/0141370 A1 | 6/2010 | Lu et al. |
| 2010/0182116 A1* | 7/2010 | Ishimoto ............. H01F 17/0006 336/192 |
| 2010/0265030 A1 | 10/2010 | Weekamp et al. |
| 2010/0308470 A1 | 12/2010 | Chen |
| 2011/0233776 A1* | 9/2011 | Lee .................... H01L 23/3114 257/737 |
| 2013/0020675 A1* | 1/2013 | Kireev ................... H01L 25/16 257/531 |
| 2013/0062730 A1* | 3/2013 | Palumbo ............. H01L 23/645 257/531 |
| 2013/0147023 A1 | 6/2013 | Lin et al. |
| 2014/0021591 A1 | 1/2014 | Sung et al. |

* cited by examiner

US 9,449,917 B2

METHOD OF FORMING AN INDUCTOR WITH MAGNETIC MATERIAL

This application is a divisional application of U.S. patent application Ser. No. 13/935,238, U.S. Pat. No. 9,041,152, filed on Jul. 3, 2013, entitled "Inductor With Magnetic Material," which claims the benefit of U.S. Provisional Application No. 61/783,735, filed on Mar. 14, 2013, entitled "Inductor With Magnetic Material," which applications are hereby incorporated herein by reference.

BACKGROUND

Since the invention of the integrated circuit (IC), the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

Inductors are essential devices in many integrated circuits, such as radio-frequency (RF) circuits. It is often required that the inductors have high inductance values. This requirement, however, is difficult to achieve on integrated circuits because high inductance needs to be achieved with the cost of high chip area usage.

Particularly in radio frequency (RF) and mixed signal designs, inductors and transformers are commonly used. To improve the inductance of inductors, three-dimensional inductors were developed, wherein an inductor may be formed in a plurality of metal layers to form a helical shape, and the portions of the inductors in different metal layers are interconnected. The further improvement of the inductors, however, is still limited, for example, due to the increasingly smaller distances between metal layers and the respective semiconductor substrate, the requirement for forming dummy patterns, and the undesirable Eddy currents in the semiconductor substrate.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a three-dimensional (3D) semiconductor structure and/or package with an interposer that includes an inductor and/or transformer. Other embodiments may also be applied, however, to other 3D structures.

Figure 1:
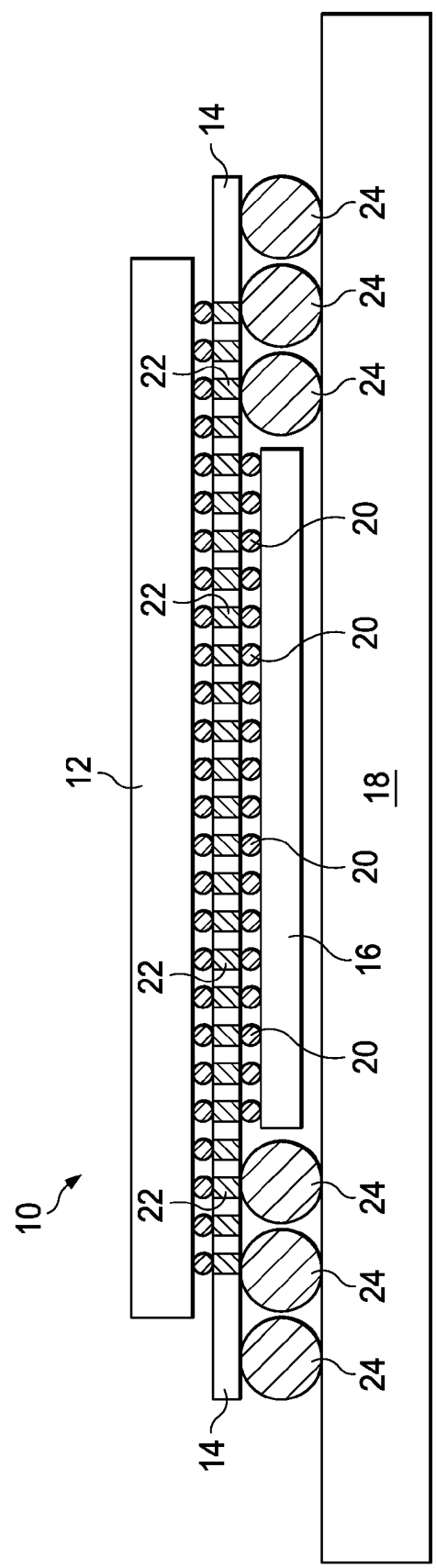
FIG. 1 is a 3D structure using an interposer according to an embodiment.

FIG. 1 illustrates a 3D structure 10 comprising an inductor and/or transformer using an interposer 14 according to an embodiment. In FIG. 1, there is shown a cross-section view of an interposer 14 with a first integrated circuit die 12 attached to a first side of the interposer 14 via conductive bumps 20 and a second integrated circuit die 16 attached to a second side of the interposer 14 via conductive bumps 20 in accordance with an embodiment. The conductive bumps 20 may include bumps, balls, pillars, columns, or the like, and may comprise, for example, microbumps having a diameter of about 5 micrometers to about 50 micrometers.

The interposer 14 is further attached to a substrate 18, which may be, for example, a packaging substrate, another die/wafer, a printed-circuit board, a high-density interconnect, or the like. Through substrate vias (TSVs) 22 in the interposer 14 provide an electrical connection between the first integrated circuit die 12 and the second integrated circuit die 16, as well as between the substrate 18 and one or both of the first integrated circuit die 12 and the second integrated circuit die 16 via conductive bumps 24. The substrate 18 may comprise further TSVs, conductive bumps, and/or components, and may be further coupled to other substrates.

The first integrated circuit die 12 and the second integrated circuit die 16 may be any suitable integrated circuit die for a particular application. For example, one of the first integrated circuit die 12 and the second integrated circuit die 16 may be a radio-frequency (RF) chip such as an RF/mixed signal integrated circuit, an RF/mixed signal micro-electrical mechanical system (HEMS) design, or the like.

Figure 2A:
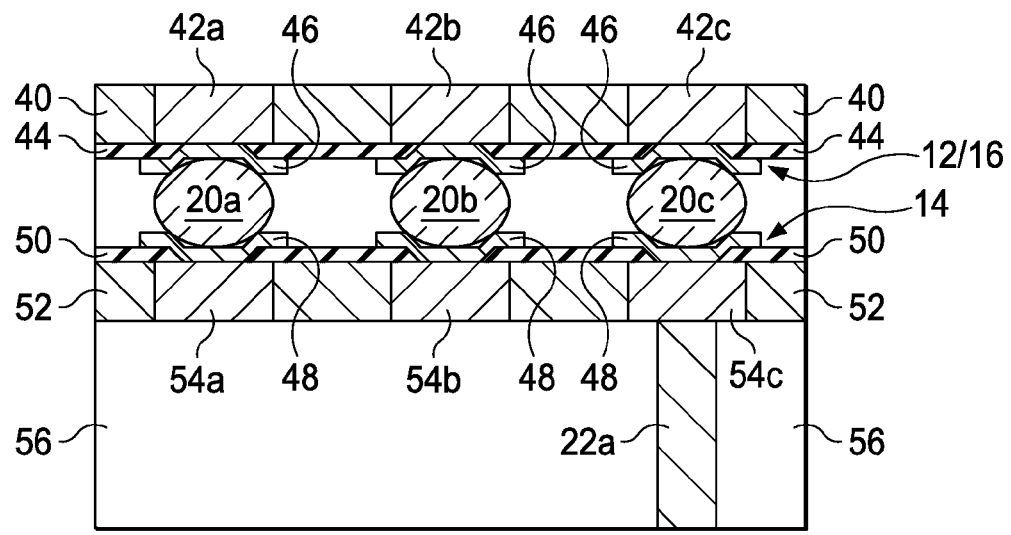
FIGS. 2A through 2D illustrate various views of a portion of a 3D structure in accordance with an embodiment.
Figure 2B:
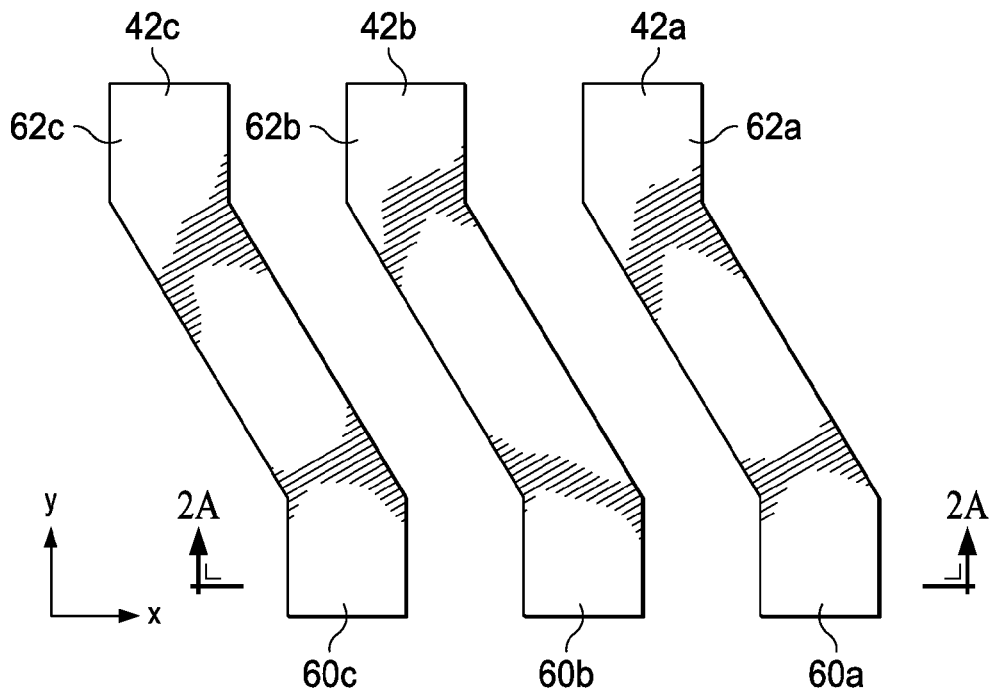
Figure 2C:
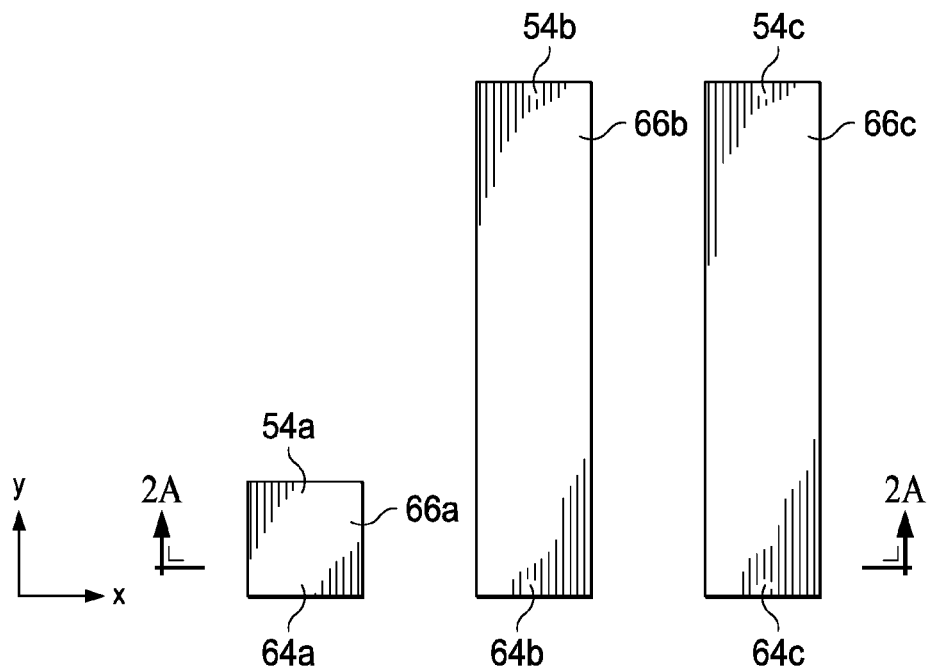
Figure 2D:
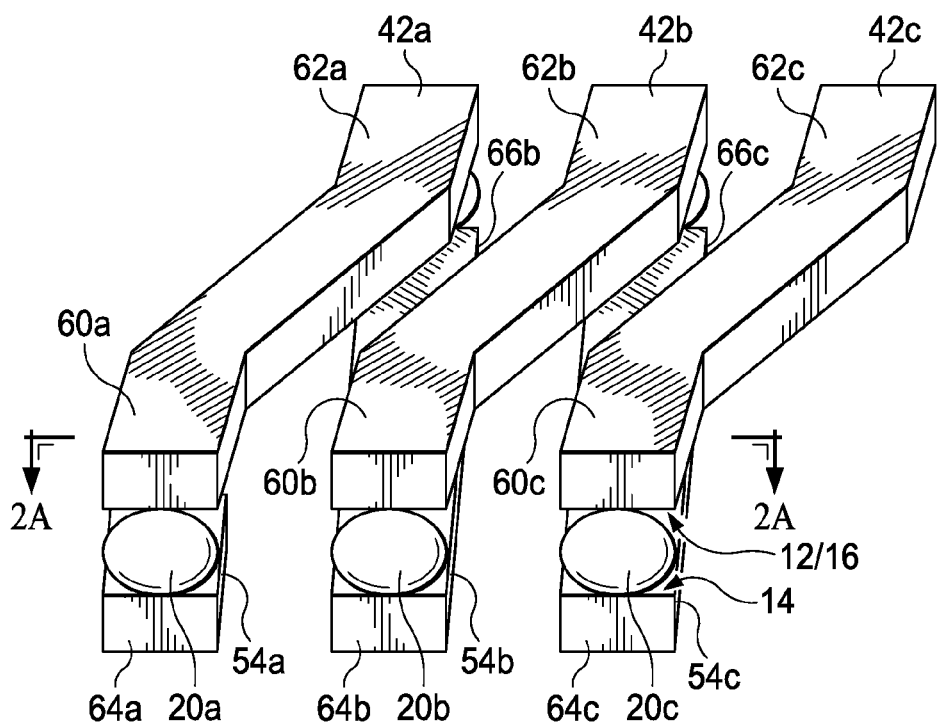

FIGS. 2A through 2D illustrate various views of a portion of a 3D structure illustrated in FIG. 1 in accordance with an embodiment, wherein the portion comprises a coil, or an inductor. These FIGS. 2A through 2D may be referenced between descriptions of each other. FIG. 2D is a simplified 3D view of the portion of the 3D structure, and FIGS. 2A through 2C are various 2D views. In particular, FIG. 2B is a plan view of a first conductive pattern 42 in the integrated circuit die 12/16, and FIG. 2C is a plan view of a second conductive pattern 54 in the interposer 14. FIG. 2A is a cross-sectional view taken along the 2A-2A line illustrated in FIGS. 2B through 2D.

FIG. 2A shows either the first integrated circuit die 12 or the second integrated circuit die 16 (referenced as the "integrated circuit die 12/16") and the interposer 14. The integrated circuit die 12/16 comprises a top metallization layer 40 in which first trace links 42a, 42b, and 42c (collectively referenced as "first conductive pattern 42") are patterned. The top metallization layer 40 may be any dielectric layer, such as borophosphosilicate glass (BPSG), silicon oxide, silicon nitride, silicon oxynitride, undoped silicate glass (USG), any combination thereof, or the like. The first conductive pattern 42 may be any conductive material, such as copper, nickel, aluminum, tungsten, titanium, any combination thereof, or the like. The top metallization layer 40 is covered by a passivation layer 44. The passivation layer 44 may be silicon oxide, silicon nitride, silicon oxynitride, any combination thereof, or the like. Underbump metal pads 46 are formed through openings in the passivation layer 44 over the first conductive pattern 42. The underbump metal pads 46 may be a metal(s), such as copper, nickel, tungsten, titanium, gold, combinations thereof, or the like. Conductive bumps 20a, 20b, and 20c (collectively referenced as 20) are formed on the underbump metal pads 46. Conductive bumps 20 may be lead free solder, eutectic lead, conductive pillars (such as copper pillars), or the like.

FIG. 2A further shows a front-side metallization layer 52 of the interposer 14 over a substrate 56, which may be silicon and may have a thickness of approximately 50 micrometers. Second trace links 54a, 54b, and 54c (collectively referenced as "second conductive pattern 54") are patterned into the front-side metallization layer 52. A passivation layer 50 is over the front-side metallization layer 52, and underbump metal pads 48 are formed through the passivation layer 50 over the second conductive pattern 54. The front-side metallization layer 52 may be any dielectric layer, such as BPSG, silicon oxide, silicon nitride, silicon oxynitride, USG, any combination thereof, or the like. The second conductive pattern 54 may be any conductive material, such as copper, nickel, aluminum, tungsten, titanium, any combination thereof, or the like. The passivation layer 50 may be silicon oxide, silicon nitride, silicon oxynitride, any combination thereof, or the like. An optional TSV 22a is illustrated as coupling to the second trace link 54c. TSV 22a may couple the structure to another integrated circuit die, the substrate 18, and/or other components. It should also be noted that the top metallization layer 40 in the integrated circuit die 12/16 and front-side metallization layer 52 in the interposer 14 may be any metallization layer with any interconnect structures between the metallization layer 40 or 52 and the underbump metal pads 46 or 48. The metallization layers 40 and 52 are illustrated as the top layer solely for simplicity of depiction and description.

FIG. 2B is a plan view of the first conductive pattern 42 in the integrated circuit die 12/16. FIG. 2B also depicts a line 2A-2A indicating the cross-section viewed in FIG. 2A. Each of the first trace links 42a, 42b, and 42c extend longitudinally in two directions. For example, first trace link 42a extends substantially only in the y-direction near the opposing ends 60a and 62a of the first trace link 42a, but extends in a direction angled from the y-axis, thus extending with both x and y-directional components, in other areas of the first trace link 42a. First trace links 42b and 42c are similarly patterned with opposing ends 60b, 60c, 62b, and 62c.

FIG. 2C is a plan view of the second conductive pattern 54 in the interposer 14. FIG. 2C depicts a line 2A-2A to indicate the cross-section viewed in FIG. 2A. Each of the second trace links 54a, 54b, and 54c extends longitudinally in the y-direction. Second trace link 54a comprises end 64a, and second trace links 54b and 54c comprise ends 64b and 66b, and 64c and 66c, respectively.

FIG. 2D is a simplified 3D view of the first conductive pattern 42 in the integrated circuit die 12/16, conductive bumps 20, and the second conductive pattern 54 in the interposer 14. End 64a of second trace link 54a is coupled by conductive bump 20a to end 60a of first trace link 42a. End 62a of first trace link 42a is coupled to end 66b of second trace link 54b by a conductive bump (not shown), and end 64b of second trace link 54b is coupled by conductive bump 20b to end 60b of first trace link 42b. End 62b of first trace link 42b is coupled to end 66c of second trace link 54c by a conductive bump (not shown), and end 64c of second trace link 54c is coupled by conductive bump 20c to end 60c of first trace link 42c. In this configuration, the first conductive pattern 42, the second conductive pattern 54, and the conductive bumps 20 form an inductor. Further, as can be seen from FIG. 2D, first trace links 42a, 42b, and 42b each extend in a second direction such that each may couple a respective pair of adjacent, parallel second trace links 54a, 54b, and 54c. Thus, first trace links 42a, 42b, and 42c each may be considered a transverse link.

Figure 3A:
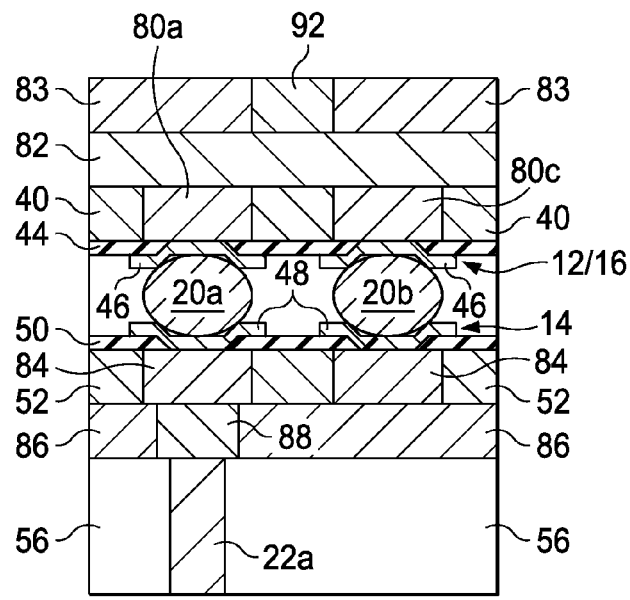
FIGS. 3A through 3D illustrate various views of a portion of a 3D structure in accordance with another embodiment.
Figure 3B:
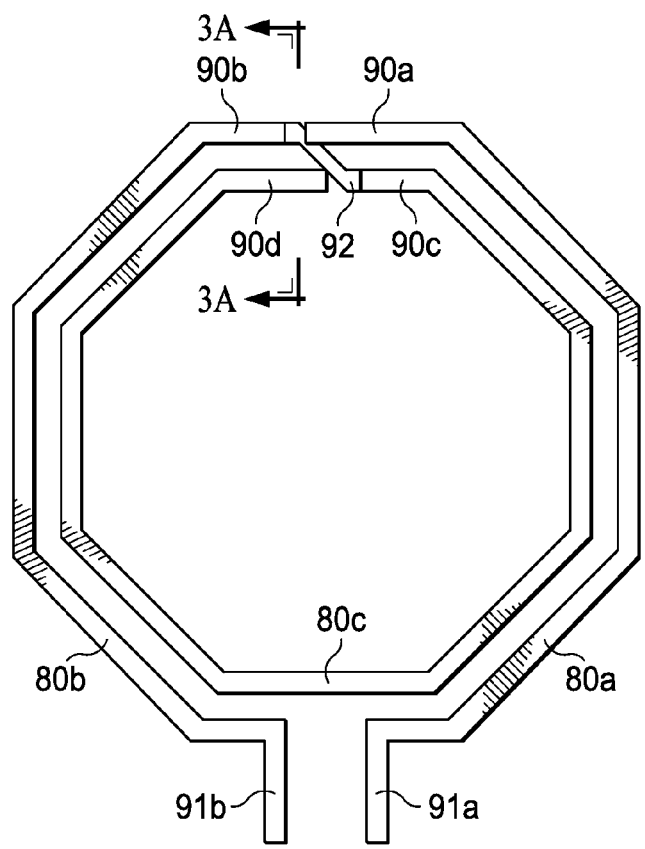
Figure 3C:
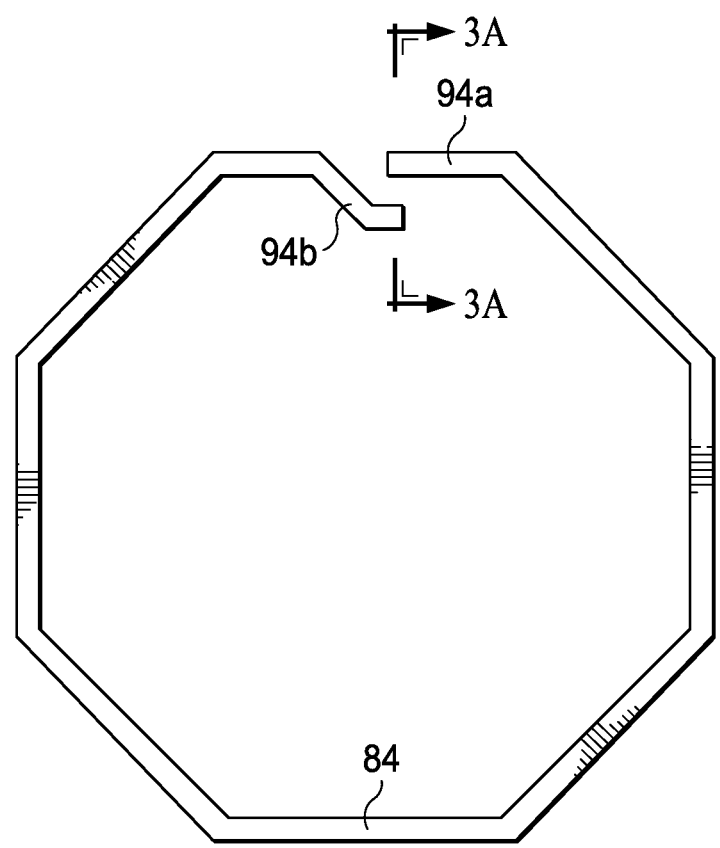
Figure 3D:
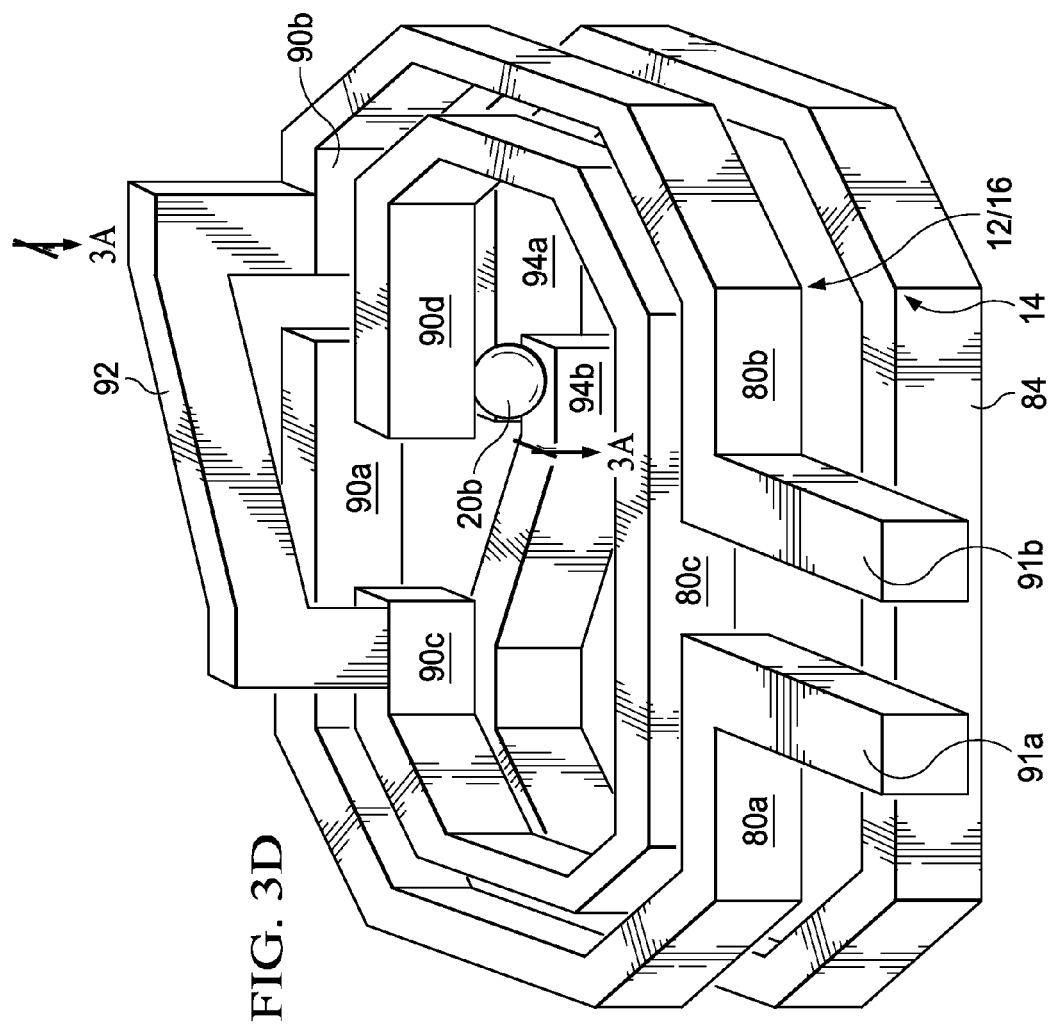

FIGS. 3A through 3D illustrate various views of a portion of a 3D structure illustrated in FIG. 1 in accordance with another embodiment, wherein the portion comprises a coil, or an inductor, by using spiral patterns in metallization layers. These FIGS. 3A through 3D may be referenced between descriptions of each other. FIG. 3D is a simplified 3D view of the portion of the 3D structure, and FIGS. 3A through 3C are various 2D views. In particular, FIG. 3B is a plan view of a first conductive pattern 80 in the integrated circuit die 12/16, and FIG. 3C is a plan view of a second conductive pattern 84 in the interposer 14. FIG. 3A is a cross-sectional view taken along the 3A-3A line illustrated in FIGS. 3B through 3D.

FIG. 3A is a cross-sectional view and further illustrates parts of a first half of an outer ring 80a, a second half of the outer ring 80b, and an inner ring 80c (collectively referenced as "first conductive pattern 80") in the top metallization layer 40, a first metallization layer 82 below the top metallization layer 40, and a second metallization layer 83 with a cross link 92 below the first metallization layer 82 in the integrated circuit die 12/16. FIG. 3A also shows parts of a ring 84 (also referenced as "second conductive pattern 84") in the front-side metallization layer 52, an additional front-side metallization layer 86 under the front-side metallization layer 52, and an interconnect structure 88 coupling the second conductive pattern 84 to the optional TSV 22a in the interposer 14.

The 3D structure will now be described with reference to the plan view of the first conductive pattern 80 in the integrated circuit die 12/16 as shown in FIG. 3B, the plan view of the second conductive pattern 84 in the interposer 14 as illustrated in FIG. 3C, and the simplified 3D illustration in FIG. 3D. With reference to FIGS. 3B and 3D, the first conductive pattern 80 forms a double ring in the shape of an octagon. The double ring starts at end 91a of the first half of the outer ring 80a and extends through a half circumference of the outer ring to end 90a. At end 90a, the first half of the outer ring 80a is electrically coupled to end 94a of the ring 84 by conductive bump 20a (not specifically illustrated in FIG. 3D).

With reference to FIGS. 3C and 3D, the ring 84 begins at end 94a and extends in a ring shape of an octagon until it reaches near end 94a and crosses to an inner area to end 94b. End 94b of the ring 84 is electrically coupled by conductive bump 20b, as shown in FIG. 3D, to end 90d of the inner ring 80c of the double ring. With reference to FIGS. 3B and 3D, beginning at end 90d, the inner ring 80c extends around the inner circumference to end 90c. End 90c of the inner ring 80c is then electrically coupled to end 90b of the second half of the outer ring 80b by the cross link 92. The cross link 92 may comprise interconnect structures in the first and second metallization layers 82 and 83 illustrated in FIG. 3A, but may be formed between other metallization layers. From end 90b, the second half of the outer ring 80b extends along the remaining half circumference of the outer ring to end 91b. Note that the shape of the ring(s) is not limited to an octagonal shape, but may also be rectangular, round, hexagonal, or the like.

In the configurations discussed with respect to FIGS. 2A through 3D, an inductor may be formed between metallization layers on an interposer and an integrated circuit die using a conductive bump as a part of the inductor coil. Using these configurations may result in an inductor that may otherwise require a larger area to be formed on the integrated circuit die. Further, using the embodiment in FIGS. 2A through 2D, the magnetic flux produced by the inductor may be directed more in a direction parallel the outer surface of the integrated circuit die on which the conductive bumps are formed, thus, reducing the magnetic flux penetrating the integrated circuit die substrate. This may reduce parasitic coupling between other devices and components on the integrated circuit die. Using the configuration in FIGS. 3A through 3D may also reduce parasitic coupling because the inductor may be further removed from other devices and components on the integrated circuit die. Another advantage of these embodiments may be that the size of the conductive materials used on the interposer may be larger and may be thicker than metals used in metallization layers on an integrated circuit die, for example the conductive materials may be 9K metal layers. Thus, these embodiments may realize a higher quality (Q) factor. Also, these embodiments may be formed more cheaply.

Figure 4:
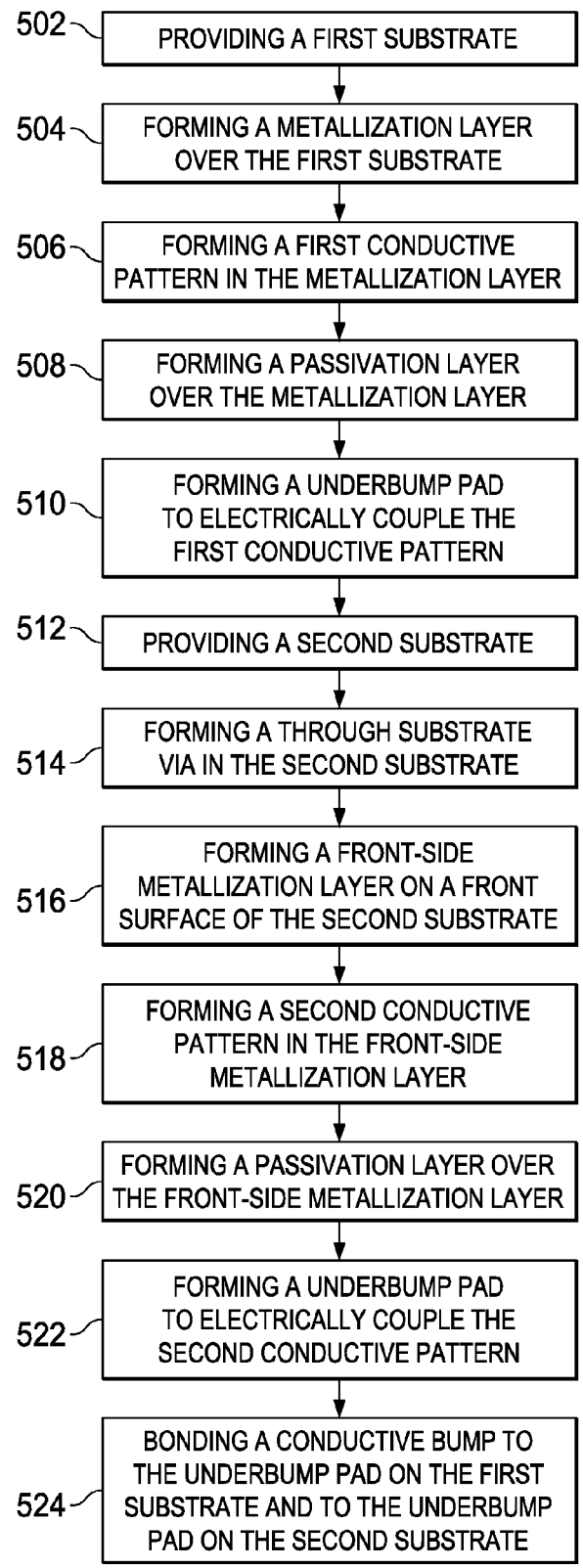
FIG. 4 is a method of forming the embodiment of FIGS. 2A through 2D according to an embodiment.

FIG. 4 is a method of forming the embodiment illustrated in FIGS. 2A through 2D. The steps discussed with regard to FIG. 4 may be performed in various sequences, and any sequence discussed herein is only for clarification of the embodiment. In step 502, a first substrate is provided. The first substrate may be an integrated circuit die, such as the first integrated circuit die 12 or the second integrated circuit die 16, during processing. For example, the first substrate may be bulk silicon with active and passive devices formed thereon with any number and combination of metallization layer dielectrics or inter-layer dielectrics (ILD) formed on the bulk silicon.

In step 504, a metallization layer is formed over the first substrate. The metallization layer may be a dielectric layer, such as BPSG, silicon oxide, silicon nitride, silicon oxynitride, USG, or the like, and may be formed using a chemical vapor deposition (CVD) technique. In step 506, a first conductive pattern is formed in the metallization layer. The pattern may be formed by using standard lithography and deposition techniques to form the pattern illustrated in FIG. 2B, for example. A damascene or dual damascene process may be used. A photoresist may be formed over the metallization layer and patterned using a lithography mask. An etch may be used to form openings in the metallization layer. The first conductive pattern may comprise conductive a material deposited in the openings using, for example, a CVD technique. The conductive material may be copper, nickel, aluminum, tungsten, titanium, combinations thereof, and/or the like. Any excess conductive material may be removed and the metallization layer may be planarized using a chemical mechanical polish (CMP).

In step 508, a passivation layer is formed over the metallization layer. Note that intervening layers, such as other metallization layers, may be formed between the metallization layer and the passivation layer. The passivation layer may be a dielectric layer, such as silicon oxide, silicon nitride, silicon oxynitride, combinations thereof, or the like, and may be formed using a CVD technique. A further passivation layer may be formed over the passivation layer using, for example, polymer based materials. In step 510, an underbump pad is formed to be electrically coupled to the first conductive pattern. This may include forming a photoresist over the passivation layer, using a lithography mask to pattern the photoresist where the underbump pad is to be formed, and etching the passivation layer to form an opening. A metal, such as copper, nickel, tungsten, titanium, gold, combinations thereof, or the like, may be conformally deposited, such as by using a CVD technique, over the passivation layer and into the opening. Excess metal may be removed by forming and patterning a photoresist and etching the exposed metals.

In step 512, a second substrate is provided. This substrate may be a bulk silicon substrate or the like. In step 514, a TSV is formed in the second substrate. For example, openings may be formed extending into the second substrate by, for example, one or more etching processes, milling, laser techniques, or the like through a front surface of the second substrate. The openings may be filled with a conductive material. The conductive material may comprise, for example, copper, tungsten, aluminum, silver, combinations thereof, or the like, formed by an electro-chemical plating process, thereby forming the TSV.

In step 516, a front-side metallization layer is formed on the front surface of the second substrate. The front-side metallization layer may be a dielectric, such as BPSG, silicon oxide, silicon nitride, silicon oxynitride, USG, or the like, and may be formed using a CVD technique. It should be noted that the front-side metallization layer may be formed adjoining the second substrate, or other layers, such as other metallization layers, may be disposed between the second substrate and the front-side metallization layer. Further, other layers, such as more metallization layers, may be formed on the front-side metallization layer. In step 518, a second conductive pattern is formed in the front-side metallization layer. The second conductive pattern may be formed by using standard lithography and deposition techniques to form the pattern illustrated in FIG. 2C, for example. A damascene or dual damascene process may be used. A photoresist may be formed over the metallization layer and patterned using a lithography mask. An etch may be used to form openings in the metallization layer. A conductive material may be deposited in the openings using, for example, a CVD technique. The conductive material may be copper, nickel, aluminum, tungsten, titanium, combinations thereof, and/or the like. Any excess conductive material may be removed and the metallization layer may be planarized using a CMP. A portion of the conductive material may be electrically coupled to the TSV formed in step 514.

In step 520, a passivation layer is formed over the front-side metallization layer. Note that intervening layers, such as other metallization layers, may be formed between the metallization layer and the passivation layer. The passivation layer may be a dielectric layer, such as silicon oxide, silicon nitride, silicon oxynitride, combinations thereof, or the like, and may be formed using a CVD technique. A further passivation layer may be formed over the passivation layer using, for example, a polymer based material. In step 522, an underbump pad is formed to be electrically coupled to the second conductive pattern. This may include forming a photoresist over the passivation layer, using a lithography mask to pattern the photoresist where the underbump pad is to be formed, and etching the passivation layer to form an opening. A metal, such as copper, nickel, tungsten, titanium, gold, combinations thereof, or the like, may be conformally deposited, such as by using a CVD technique, over the passivation layer and into the opening. Excess metal may be removed by forming and patterning a photoresist and etching the exposed metals.

In step 524, a conductive bump is bonded to the underbump pad on the first substrate formed in step 510 and to the underbump pad on the second substrate formed in step 522. This may be performed using acceptable soldering techniques, and the conductive bump may be lead free solder, eutectic lead, a copper pillar, or the like. Thus, the first substrate may be bonded to the second substrate, such as in a flip-chip configuration. The first substrate may be one of the first integrated circuit die 12 or the second integrated circuit die 16 discussed above. The second substrate may be a finished interposer 14 or an unfinished interposer in intermediate processing. For example, if the second substrate is an unfinished interposer, the second substrate may be thinned on the back surface to expose a portion of the TSV through the back surface. Metallization layers may be formed on the back surface with interconnects and other devices formed therein, and some of the interconnects and/or devices may electrically couple some of the TSVs. Another integrated circuit die may be bonded to the finished interposer, and connections between the first substrate and the integrated circuit die may be made. The interposer may also be connected to other substrates, such as a printed circuit board (PCB). Other details may be ready understood by persons having ordinary skill in the art, and are therefore omitted herein for brevity.

Figure 5:
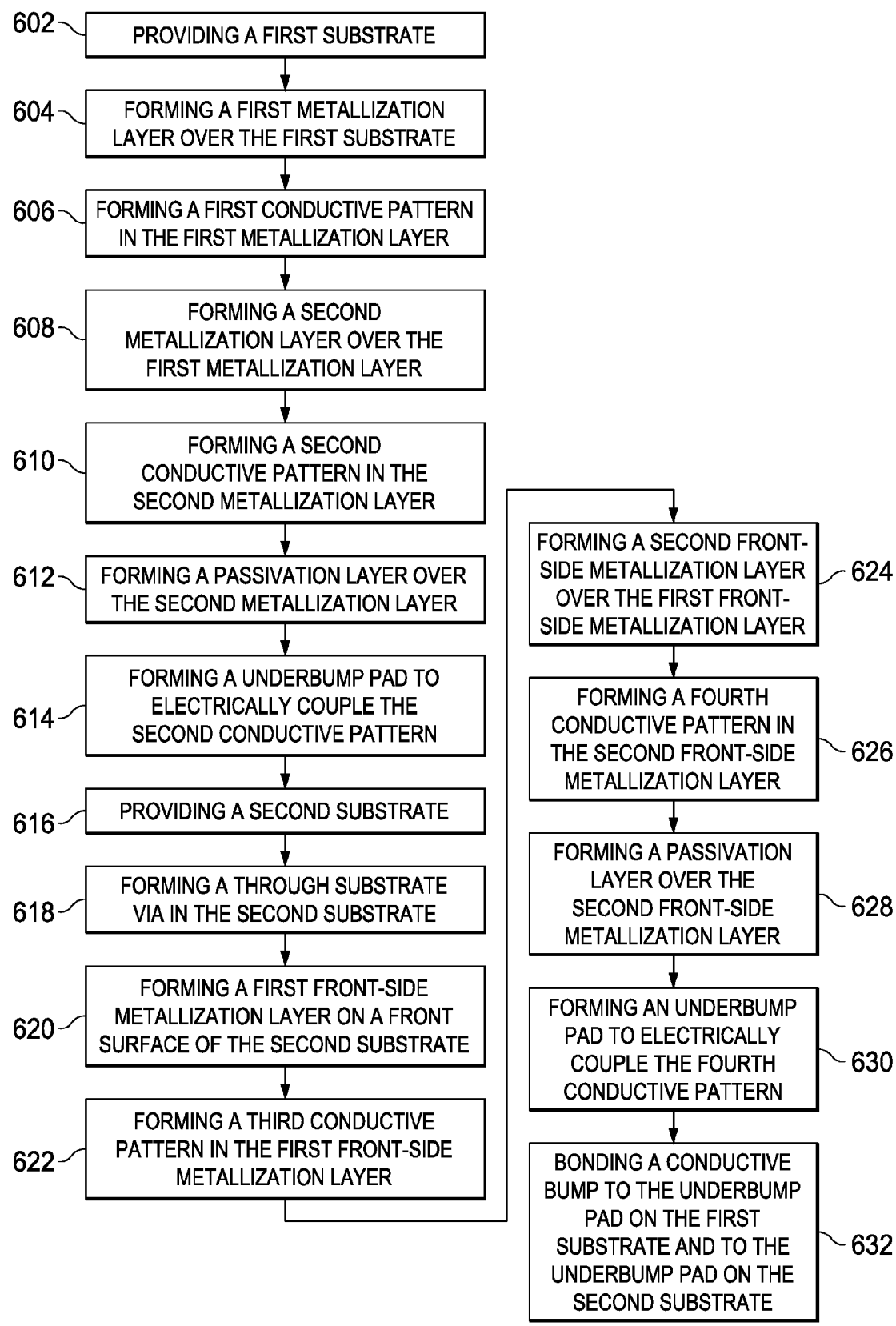
FIG. 5 is a method of forming the embodiment of FIGS. 3A through 3D according to another embodiment.

FIG. 5 is a method of forming the embodiment illustrated in FIGS. 3A through 3D. The steps discussed with regard to FIG. 5 may be performed in various sequences, and any sequence discussed herein is only for clarification of the embodiment. Further, many of the steps in FIG. 5 are similar to those discussed in conjunction with FIG. 4, and many of the details of those steps are omitted in the discussion of FIG. 5 for brevity.

In step 602, a first substrate is provided, similar to step 502 above. In step 604, a first metallization layer is formed over the first substrate, and in step 606 a first conductive pattern, such as cross link 92 in FIG. 3B, is formed. In step 608, a second metallization layer is formed over the first metallization layer, and in step 610, a second conductive pattern, such as the first conductive pattern 80 in FIG. 3B, is formed. A passivation layer is formed over the second metallization layer in step 612. In step 614, an underbump pad is formed to electrically couple the second conductive pattern through the passivation layer.

In step 616, a second substrate is provided, similar to step 512 above. In step 618, a TSV is formed in the second substrate, similar to step 514. In step 620, a first front-side metallization layer is formed on a front surface of the second substrate, and in step 622, a third conductive pattern, such as interconnect structure 88 in FIG. 3A, is formed. In step 624, a second front-side metallization layer is formed over the first front-side metallization layer, and in step 626, a fourth conductive pattern, such as the second conductive pattern 84 in FIG. 3C, is formed. A passivation layer is formed over the second front-side metallization layer in step 628. In step 630, an underbump pad is formed to electrically couple the fourth conductive pattern through the passivation layer. In step 632, a conductive bump is bonded to the underbump pad on the first substrate formed in step 614 and to the underbump pad on the second substrate formed in step 630. Further processing may be performed on the second substrate, as discussed above.

Figure 6A:
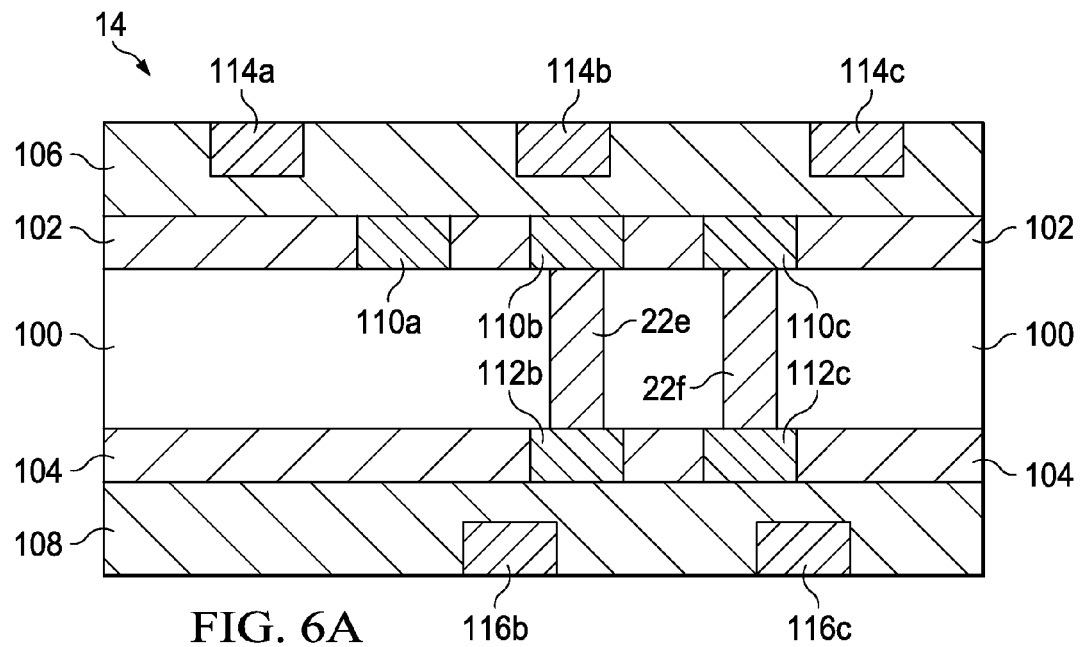
FIGS. 6A through 6H illustrate various views of a portion of a 3D structure in accordance with a further embodiment.
Figure 6B:
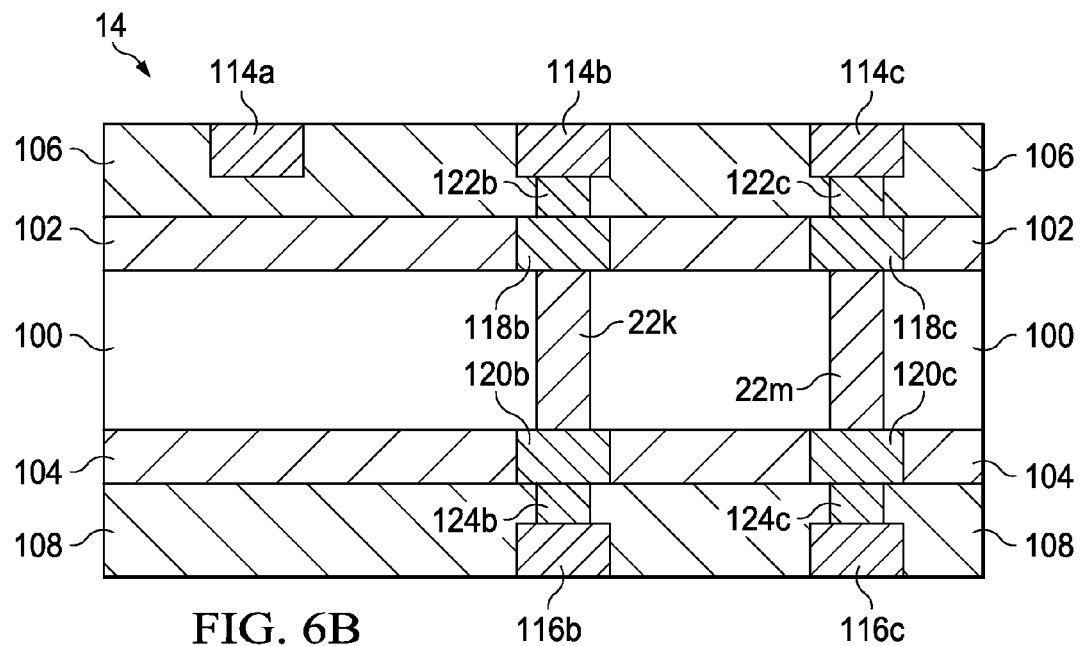
Figure 6C:
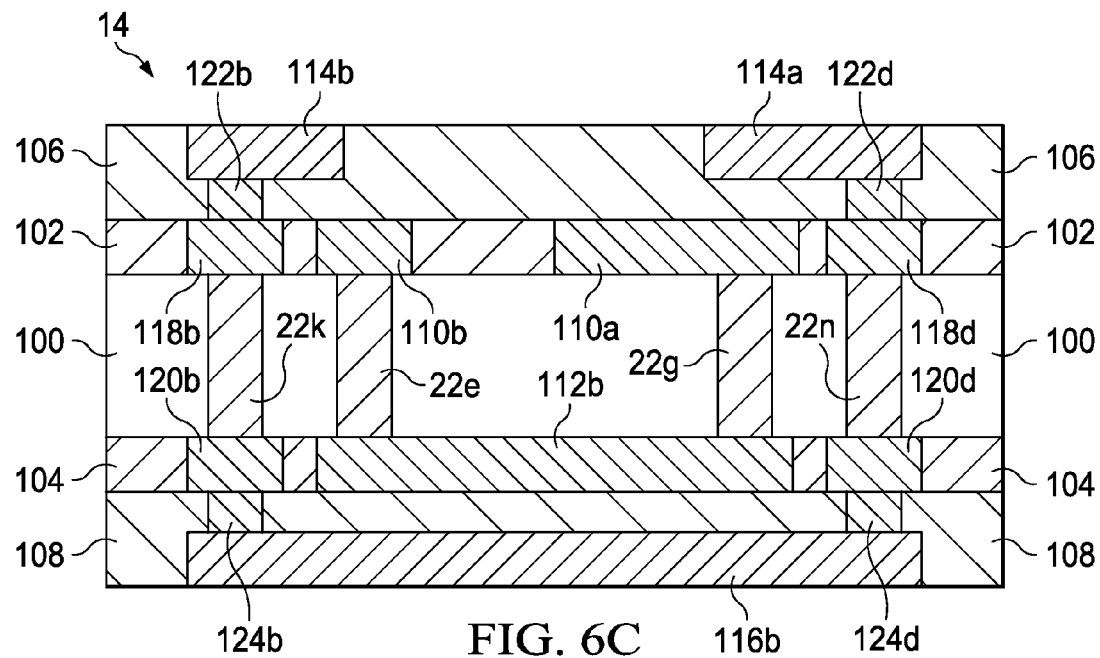
Figure 6D:
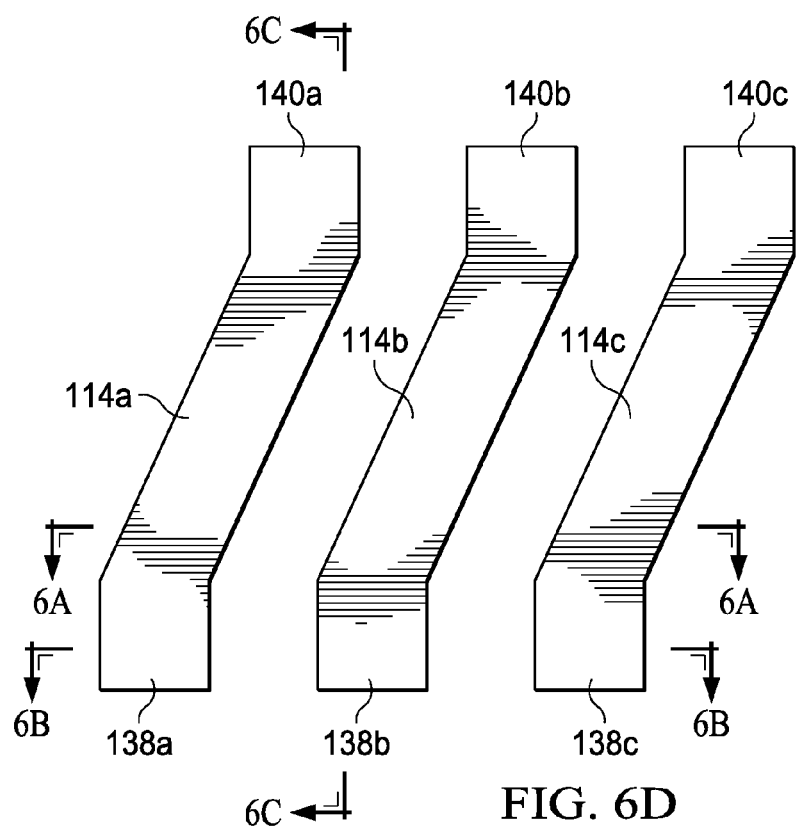
Figure 6E:
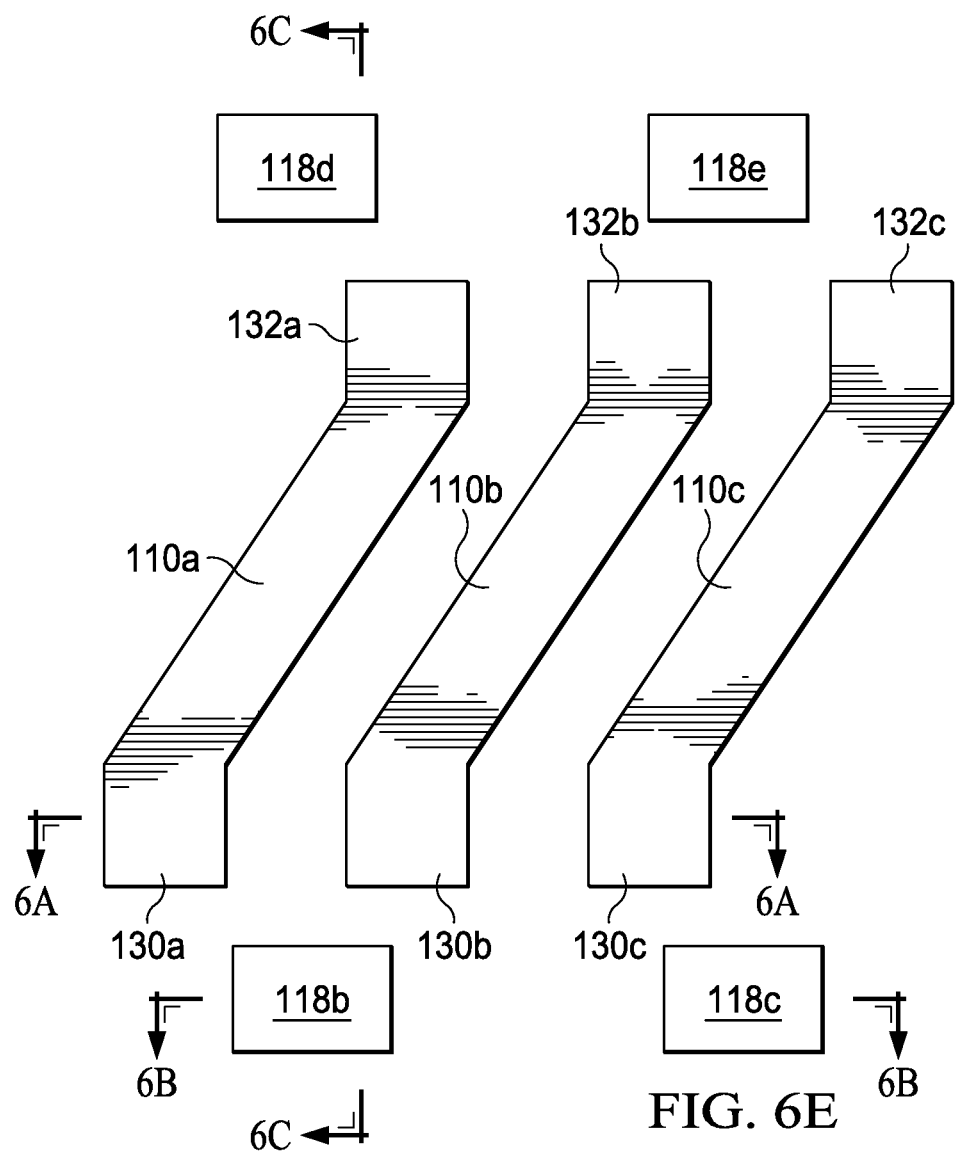
Figure 6F:
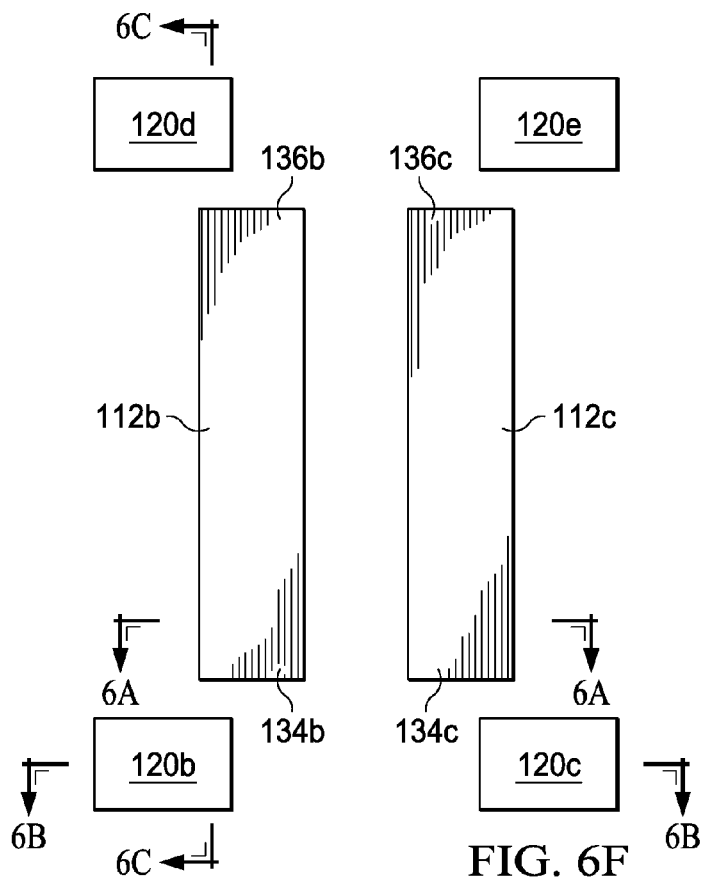
Figure 6G:
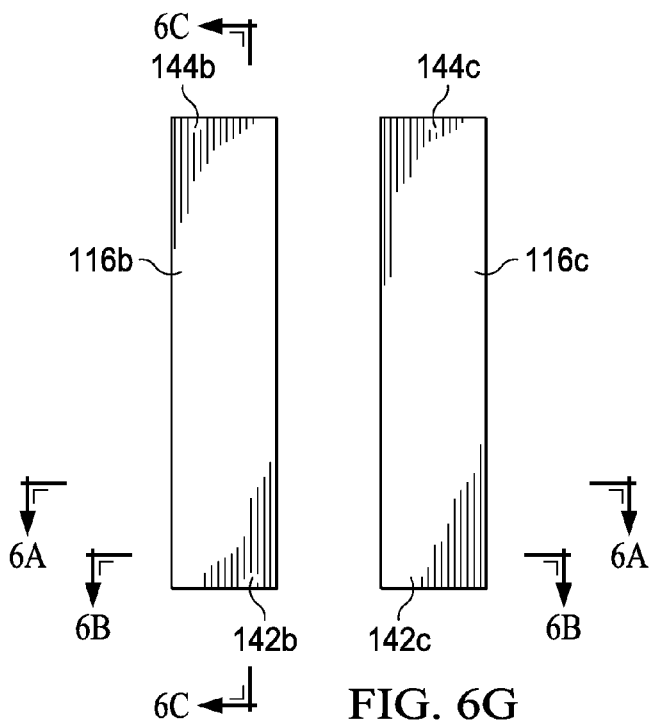
Figure 6H:
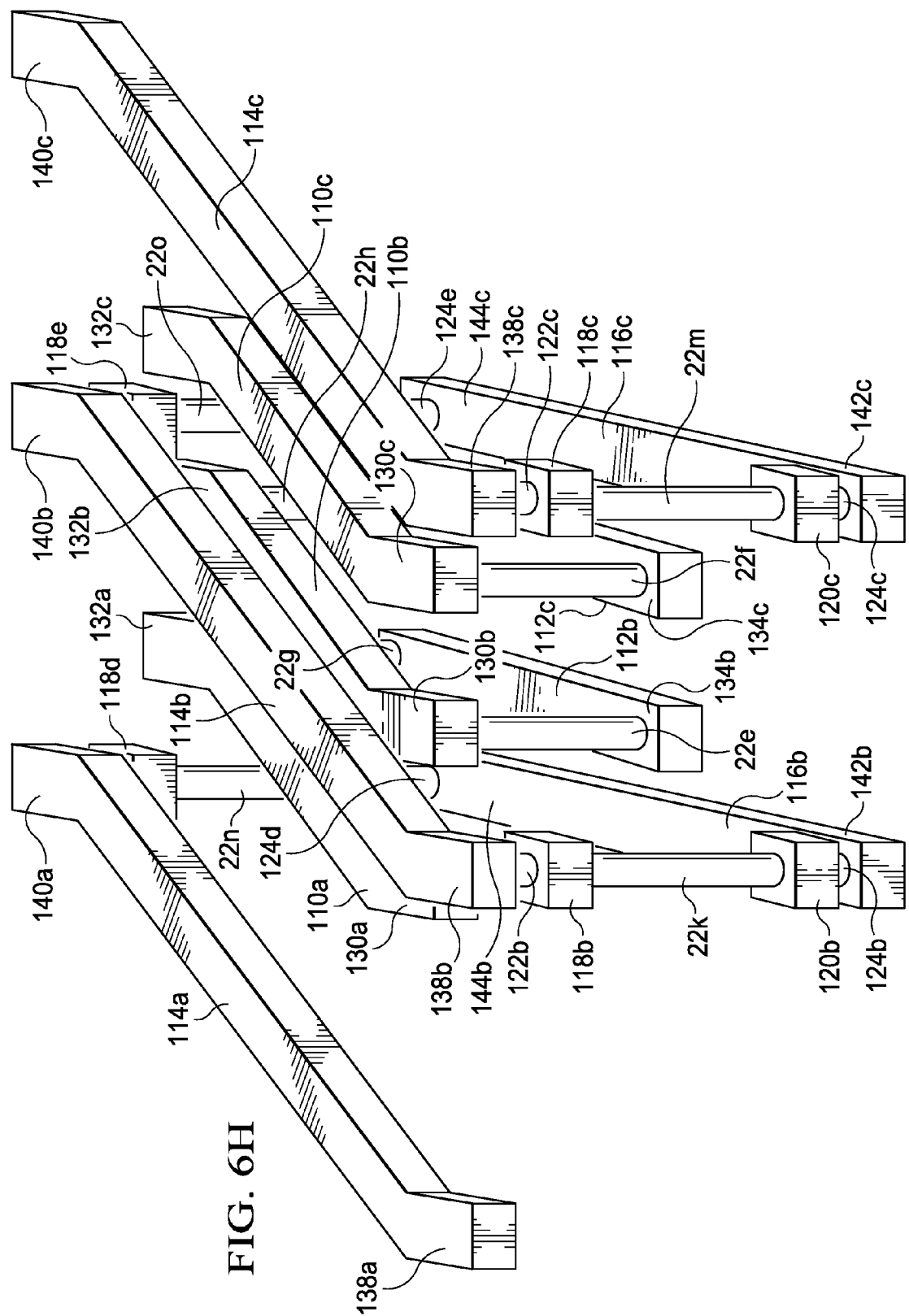

FIGS. 6A through 6C illustrate various cross-section views of a portion of a 3D structure illustrated in FIG. 1 in accordance with a further embodiment that comprises a coil, inductor, and/or transformer. FIGS. 6A through 6H may be referenced between descriptions of each other for a clearer understanding. FIG. 6H is a simplified 3D view of the portion of the 3D structure, and FIGS. 6A through 6G are various 2D views. In particular, FIG. 6D is a plan view of a second conductive pattern 114 in the second front-side metallization layer 106, and FIG. 6G is a plan view of a fourth conductive pattern 116 in the second back-side metallization layer 108. The conductive patterns in FIGS. 6D and 6G form a portion of an outer coil. FIG. 6E is a plan view of a first conductive pattern 110 and contact pads 118 in the first front-side metallization layer 102, and FIG. 6F is a plan view of a third conductive pattern 112 and contact pads 120 in the first back-side metallization layer 104. The conductive patterns in FIGS. 6E and 6F form a portion of an inner coil. FIGS. 6A, 6B, and 6C are each a cross-sectional view taken along the lines 6A-6A, 6B-6B, and 6C-6C, respectively, illustrated in FIGS. 6D through 6G. Further, like reference numerals in FIGS. 6A through 6H refer to the same components.

With reference to FIG. 6A, there is shown a substrate 100 of the interposer 14. While the substrate may be any material, in this embodiment, the substrate 100 may be silicon, where the first integrated circuit die 12 and the second integrated circuit die 16 are formed from silicon. It should be noted that the material of the substrate 100 may be the same material from which any of the integrated circuit dice are formed to reduce coefficient of thermal expansion (CTE) mismatch. A first front-side metallization layer 102 is over the front surface of the substrate 100, and a second front-side metallization layer 106 is over the first front-side metallization layer 102. A first back-side metallization layer 104 is on the back surface of the substrate 100, and a second back-side metallization layer 108 is on the first back-side metallization layer 104. The metallization layers may be any dielectric material, for example, BPSG, silicon oxide, silicon nitride, silicon oxynitride, USG, combinations thereof, and the like.

First trace links 110a, 110b, and 110c (collectively referenced as "first conductive pattern 110") are patterned and formed in the first front-side metallization layer 102, and second trace links 114a, 114b, and 114c (collectively referenced as "second conductive pattern 114") are patterned and formed in the second front-side metallization layer 106. Third trace links 112b and 112c (collectively referenced as "third conductive pattern 112") are patterned and formed in the first back-side metallization layer 104, and fourth trace links 116b and 116c (collectively referenced as "fourth conductive pattern 116") are patterned and formed in the second back-side metallization layer 108. Conductive patterns 110, 112, 114, and 116 may comprise a metal(s), such as copper, nickel, aluminum, tungsten, titanium, combinations thereof, or the like. TSV 22e penetrates through the substrate 100 to couple first trace link 110b to third trace link 112b, and TSV 22f penetrates through the substrate 100 to couple first trace link 110c to third trace link 112c.

In the view of FIG. 6B, it is shown that contact pads 118b and 118c (collectively referenced as 118) are formed in the first front-side metallization layer 102, and that contact pads 120b and 120c (collectively referenced as 120) are formed in the first back-side metallization layer 104. Contact pads 118 and 120 may be the same material as the first conductive pattern 110 and the third conductive pattern 112, respectively. Second trace link 114b is coupled to contact pad 118b by a via 122b in the second front-side metallization layer 106. TSV 22k penetrates through the substrate 100 to couple the contact pad 118b to contact pad 120b. The contact pad 120b is coupled to fourth trace link 116b by a via 124b in the second back-side metallization layer 108. Similarly, second trace link 114c, via 122c, contact pad 118c, TSV 22m, contact pad 120c, via 124c, and fourth trace link 116c are electrically coupled together.

With reference to FIG. 6C, there is further shown a via 122d, a contact pad 118d, TSVs 22g and 22n, a contact pad 120d, and a via 124d. The via 122d is in the second front-side metallization layer 106 and couples second trace link 114a to the contact pad 118d in the first front-side metallization layer 102. The TSV 22n penetrates through the substrate 100 to couple the contact pad 118d to the contact pad 120d in the first back-side metallization layer 104. The via 124d is in the second back-side metallization layer 108 and couples fourth trace link 116a to the contact pad 120d. The TSV 22g couples first trace link 110a to third trace link 112b.

FIG. 6D illustrates a plan view of the second conductive pattern 114 in the second front-side metallization layer 106. The second trace links 114a, 114b, and 114c each extend longitudinally in two directions. For example, second trace link 114a extends substantially only in one first direction near the opposing ends 138a and 140a of the second trace link 114a, but extend in a direction angled from the first direction in a second direction in other areas of the second trace link 114a. Second trace links 114b and 114c are similarly patterned with opposing ends 138b, 138c, 140b, and 140c. Second trace links 114a, 114b, and 114c each may be a transverse link of the outer coil, as discussed in more detail with respect to FIG. 6H.

FIG. 6E illustrates a plan view of the first conductive pattern 110 and contact pads 118 in the first front-side metallization layer 102. Similar to the second conductive pattern 114 in FIG. 6D, the first trace links 110a, 110b, and 110c each extend longitudinally in two directions, with opposing ends 130a, 130b, 130c, 132a, 132b, and 132c. Contact pads 118 lie outside of the area where the first conductive pattern 110 is formed. Contact pad 118b is aligned under end 138b of second trace link 114b, and contact pad 118c is aligned under end 138c of second trace link 114c. Contact pad 118d is aligned under end 140a of second trace link 114a, and contact pad 118e is aligned under end 140b of the second trace link 114b. First trace links 110a, 110b, and 110c each may be a transverse link of the inner coil, as discussed in more detail with respect to FIG. 6H.

FIG. 6F illustrates a plan view of the third conductive pattern 112 and contact pads 120 in the first back-side metallization layer 104. The third trace links 112b and 112c each extend longitudinally in the same first direction as the ends 138 and 140 of the second conductive pattern 114 in FIG. 6D and the ends 130 and 132 of the first conductive pattern 110 in FIG. 6E. Third trace links 112b and 112c comprise ends 134b and 136b, and 134c and 136c, respectively. Contact pads 120 lie outside of the area where the third conductive pattern 112 is located and are aligned as discussed with reference to FIG. 6G. Third trace links 112b and 112c each may be a straight link of the inner coil.

FIG. 6G illustrates a plan view of the fourth conductive pattern 116 in the second back-side metallization layer 108. Fourth trace links 116b and 116c each extend longitudinally in the same first direction as the third trace links 112b and 112c in FIG. 6F. Fourth trace links 116b and 116c comprise ends 142b and 144b, and 142c and 144c, respectively. Contact pad 120b in FIG. 6F is aligned with end 142b of fourth trace link 116b, and contact pad 120c is aligned with end 142c of fourth trace link 116c. Contact pad 120d is aligned with end 144b of fourth trace link 116b, and contact pad 120e is aligned with end 144c of fourth trace link 116c. Fourth trace links 116b and 116c each may be a straight link of the outer coil.

FIG. 6H is a 3D view of the structure of the conductive materials, TSVs, contact pads, and vias. The structure comprises two coils—an inner coil and an outer coil. The outer coil will be described first. End 138a of second trace link 114a may be electrically coupled to other structures, such as an interconnect structure, a via, a TSV, the integrated circuit dies, or the like. End 140a of the second trace link 114a is coupled to via 122d (not shown), which is coupled to contact pad 118d. Contact pad 118d is coupled to contact pad 120d (not shown) by TSV 22n. Contact pad 120d is coupled to end 144b of fourth trace link 116b by via 124d. End 142b of the fourth trace link 116b is coupled to contact pad 120b by via 124b. Contact pad 120b is coupled to contact pad 118b by TSV 22k. Contact pad 118b is coupled to end 138b of second trace link 114b by via 122b. End 140b of the second trace link 114b is coupled to via 122e (not shown), which is coupled to contact pad 118e. Contact pad 118e is coupled to contact pad 120e (not shown) by TSV 22o. Contact pad 120e (not shown) is coupled to end 144c of fourth trace link 116c by via 124e. End 142c of the fourth trace link 116c is coupled to contact pad 120c by via 124c. Contact pad 120c is coupled to contact pad 118c by TSV 22m. Contact pad 118c is coupled to end 138c of second trace link 114c by via 122c. End 140c of the second trace link 114c may be electrically coupled to other structures, such as an interconnect structure, a via, a TSV, the integrated circuit dies, or the like. As can be seen from FIG. 6H, second trace links 114a, 114b, and 114c each extend in a second direction such that each may couple a respective pair of adjacent, parallel fourth trace links 116b and 116c. Thus, the second trace links 114a, 114b, and 114c each may be considered a transverse link.

The inner coil will now be described. End 130a of first trace link 110a may be electrically coupled to other structures, such as an interconnect structure, a via, a TSV, the integrated circuit dies, or the like. End 132a of the first trace link 110a is coupled to end 136b of third trace link 112b by TSV 22g. End 134b of the third trace link 112b is coupled to end 130b of first trace link 110b by TSV 22e. End 132b of the first trace link 110b is coupled to end 136c (not shown) of third trace link 112c by TSV 22h. End 134c of the third trace link 112c is coupled to end 130c of first trace link 110c by TSV 22f. End 132c of the first trace link 110c may be electrically coupled to other structures, such as an interconnect structure, a via, a TSV, the integrated circuit dies, or the like. As can be seen from FIG. 6H, first trace links 110a, 110b, and 110c each extend in a second direction such that each may couple a respective pair of adjacent, parallel third trace links 112b and 112c. Thus, the first trace links 110a, 110b, and 110c each may be considered a transverse link.

Figure 7A:
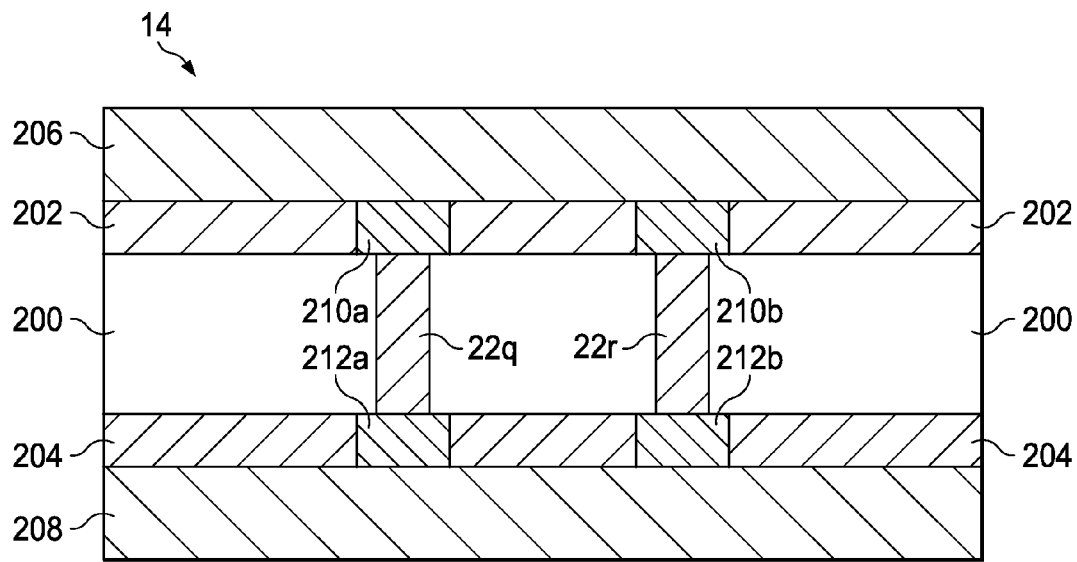
FIGS. 7A through 7D illustrate various views of a portion of a 3D structure in accordance with a yet further embodiment.
Figure 7B:
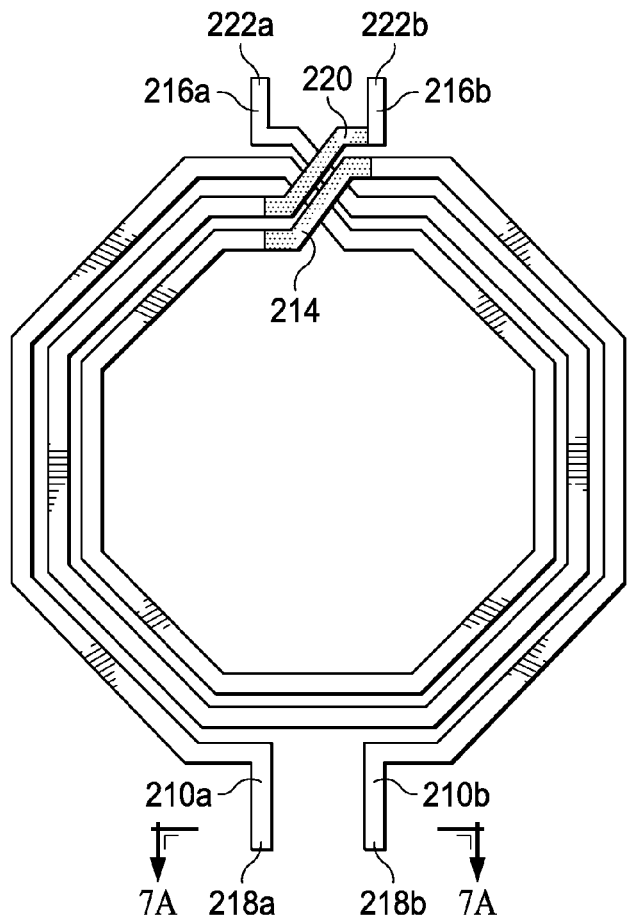
Figure 7C:
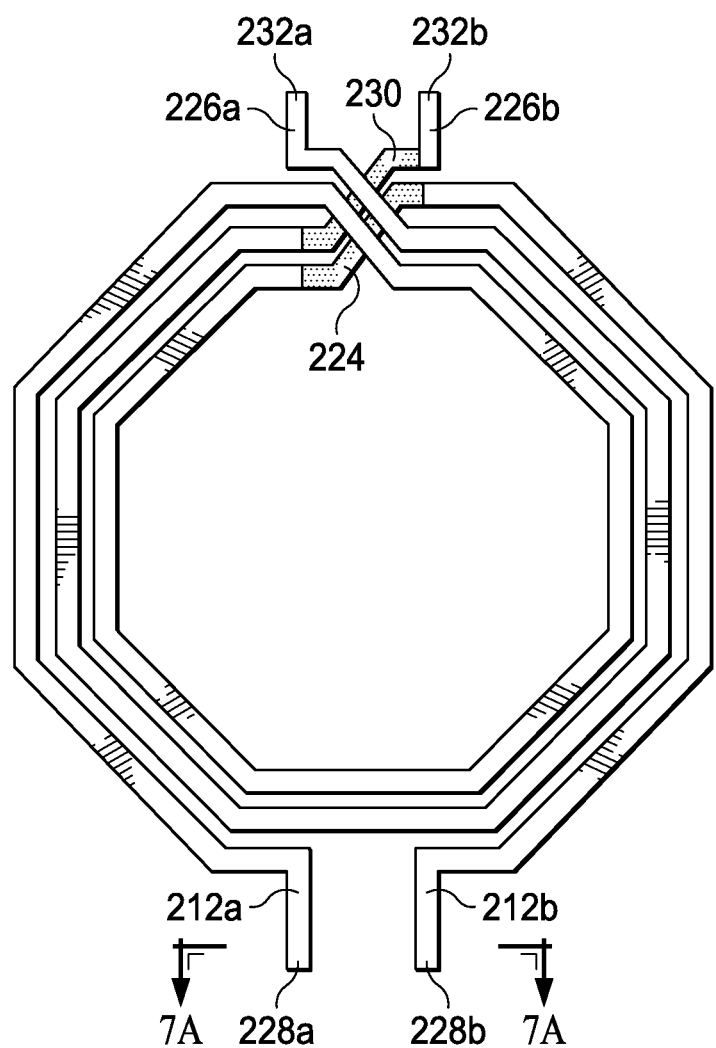
Figure 7D:
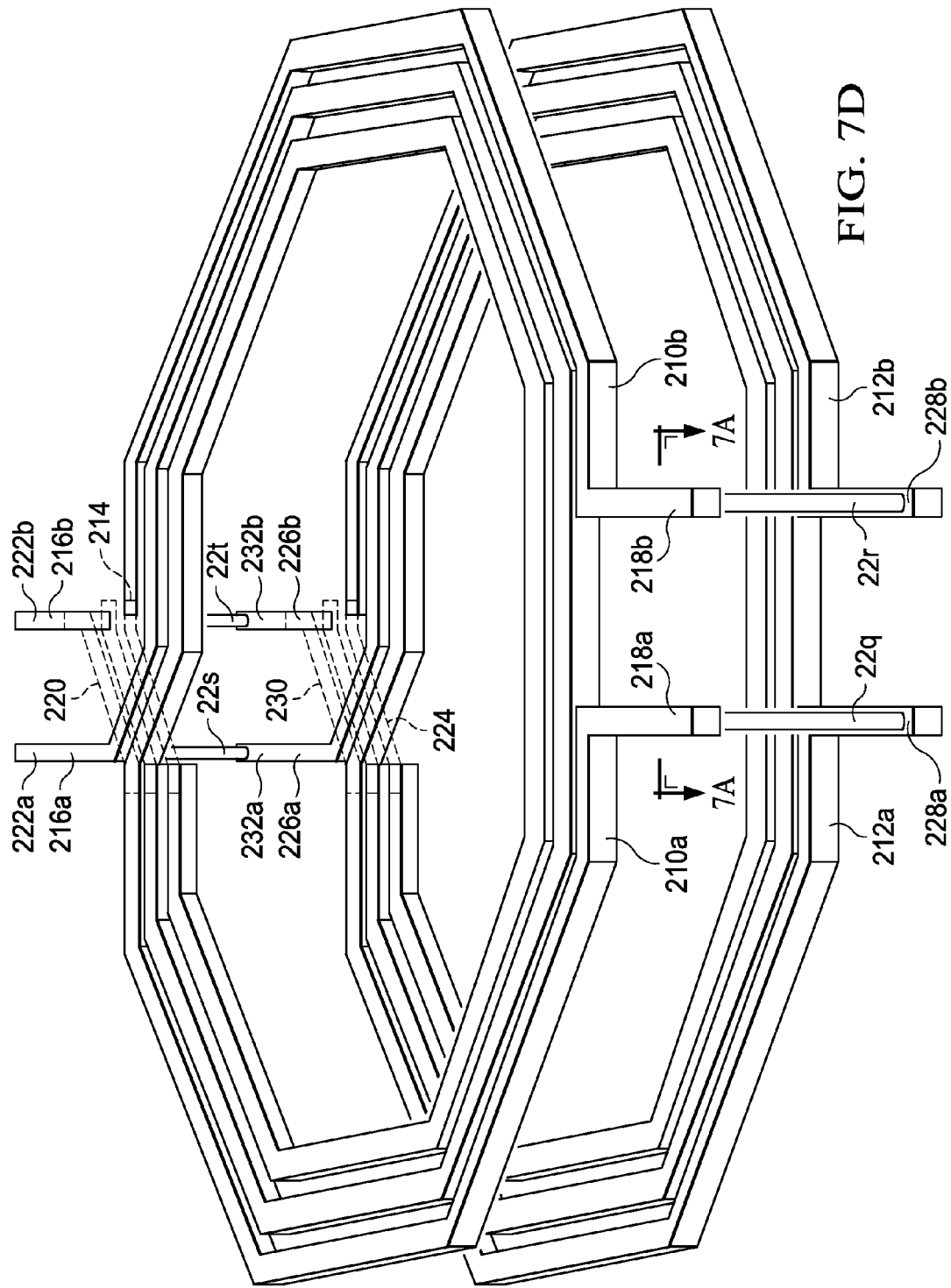

FIGS. 7A through 7D illustrate various views of a portion of a 3D structure illustrated in FIG. 1 in accordance with a yet further embodiment that comprises a coil, inductor, and/or transformer. FIGS. 7A through 7D may be referenced between each other for a clearer understanding. FIG. 7D is a simplified 3D view of the portion of the 3D structure, and FIGS. 7A through 7C are various 2D views. In particular, FIG. 7B is a plan view of conductive patterns in the first and second front-side metallization layers 202 and 206, and FIG. 7C is a plan view of conductive patterns in the first and second back-side metallization layers 204 and 208. FIG. 7A is a cross-sectional view taken along the 7A-7A line illustrated in FIGS. 7B through 7D. Further, like reference numerals in FIGS. 7A through 7D refer to the same components.

FIG. 7A illustrates a cross-section view of a portion of a 3D structure illustrated in FIG. 1. FIG. 7A shows a substrate 200 with a first front-side metallization layer 202 formed on a front surface of the substrate 200, and a second front-side metallization layer 206 formed on the first front-side metallization layer 202. A first back-side metallization layer 204 is formed on the a second surface of the substrate 200 opposite from the first, and a second back-side metallization layer 208 is formed on the first back-side metallization layer 204. Parts of a first spiral 210a and 210b (collectively referenced as "first spiral pattern 210") are in the first front-side metallization layer 202, and parts of a third spiral 212a and 212b (collectively referenced as "third spiral pattern 212") are in the first back-side metallization layer 204. TSV 22q may penetrate through the substrate 200 to couple the first part of the first spiral 210a to the first part of the third spiral 212a, and TSV 22r may penetrate through the substrate 200 to couple the second part of the first spiral 210b to the second part of the third spiral 212b.

FIG. 7B illustrates the first spiral pattern 210, parts of a second spiral 216a and 216b (collectively referenced as "second spiral pattern 216"), and other patterns in the first and second front-side metallization layers 202 and 206. Line 7A-7A indicates the cross section view in FIG. 7A. End 218a of the first part of the first spiral 210a extends from the periphery of a ring formed by the first spiral pattern 210 and the second spiral pattern 216 (collective referenced as "first conductive pattern 210/216") in a direction perpendicular to the periphery. The first part of the first spiral 210a extends along half a circumference of an outer ring before it crosses into an inner ring where it extends along the entire circumference of the inner ring. At the completion of the inner ring, the first part of the first spiral 210a is coupled to a cross link 214. (See FIG. 7D for a 3D view of cross link 214.) Cross link 214 is in the second front-side metallization layer 206 and may comprise a via coupled to the first part of the first spiral 210a, a metal line coupled to the via, and another via coupled to the metal line and the second part of the first spiral 210b. The second part of the first spiral 210b then extends from the crossover point around the second half of the circumference of the outer ring until it extends perpendicularly from the periphery at end 218b near end 218a.

FIG. 7B further illustrates parts of the second spiral 216a and 216b. At end 222a, the first part of the second spiral 216a extends perpendicularly from the periphery of the outer ring opposite from where the first spiral pattern 210 extends perpendicularly. The first part of the second spiral 216a then extends in an intermediate ring and around the circumference of the intermediate ring. At the crossover point, the first part of the second spiral 216a is coupled to a cross link 220 in the second front-side metallization layer 206. (See FIG. 7D for a 3D view of cross link 220.) Cross link 220 may be similar to cross link 214. Cross link 220 is then coupled to end 222b of the second part of the second spiral 216b, which extends perpendicularly from the periphery of the outer ring near end 222a.

FIG. 7C illustrates the third spiral pattern 212, parts of a fourth spiral 226a and 226b (collectively referenced as "fourth spiral pattern 226"), and other patterns in the first and second back-side metallization layers 204 and 208. Line 7A-7A indicates the cross section view in FIG. 7A. The first and second parts of the third spiral 212a and 212b with ends 228a and 228b, respectively, extending perpendicularly from the periphery of the third spiral pattern 212 and the fourth spiral pattern 226 (collective referenced as "second conductive pattern 212/226"), and the first and second parts of the fourth spiral 226a and 226b with ends 232a and 232b, respectively, extending perpendicularly from the periphery second conductive pattern 212/226, are similar to that of the first and second spiral patterns 210 and 216 in FIG. 7B. Cross link 224 couples the first part of the third spiral 212a to the second part of the third spiral 212b, and cross link 230 couples the first part of the fourth spiral 226a to the second part of the fourth spiral 226b. Cross link 224 and cross link 230 are formed in the second back-side metallization layer 208. (See FIG. 7D for a 3D view of cross links 224 and 230.)

FIG. 7D illustrates a 3D view of the first and second conductive patterns 210/216 and 212/226, cross links 214, 220, 224, and 230, and possible TSVs. In this configuration, TSV 22q may couple the first part of the first spiral 210a at end 218a to the first part of the third spiral 212a at end 228a, and TSV 22r may couple the second part of the first spiral 210b at end 218b to the second part of the third spiral 212b at end 228b. Similarly, TSV 22s may couple the first part of the second spiral 216a at end 222a to the first part of the fourth spiral 226a at end 232a, and TSV 22t may couple the second part of the second spiral 216b at end 222b to the second part of the fourth spiral 226b at end 232b. It may not be desirable to have TSVs 22q, 22r, 22s, and 22t all present. One configuration may include TSVs 22r and 22s but not TSVs 22q and 22t, and another configuration may include TSVs 22q and 22t but not TSVs 22r and 22s. Any of the ends of the spirals may be electrically coupled to other structures, such as an interconnect structure, a via, a TSV, the integrated circuit dies, or the like.

The structures in FIGS. 6A through 7D may therefore form transformers. Inductors may be used to form these transformers and may be formed on metallization layers on an interposer using a TSV as a part of the inductor coil. Using these configurations may result in an inductor that may otherwise require a larger area to be formed on the integrated circuit die. Further, using the embodiment in FIGS. 6A through 6H, the magnetic flux produced by the inductors may be directed more in a direction parallel to the outer surface of the integrated circuit die on which the conductive blimps are formed, thus, reducing the magnetic flux penetrating the integrated circuit die substrate. This may reduce parasitic coupling between other devices and components on the integrated circuit die. Using the configuration in FIGS. 7A through 7D may also reduce parasitic coupling because the inductors may be further removed from other devices and components on the integrated circuit die. Another advantage of these embodiments may be that the size of the conductive materials used on the interposer may be larger and may be thicker than metals used in metallization layers on an integrated circuit die, for example the conductive materials may be 9K metal layers. Thus, these embodiments may realize a higher quality (Q) factor. Also, these embodiments may be formed more cheaply.

Figure 8:
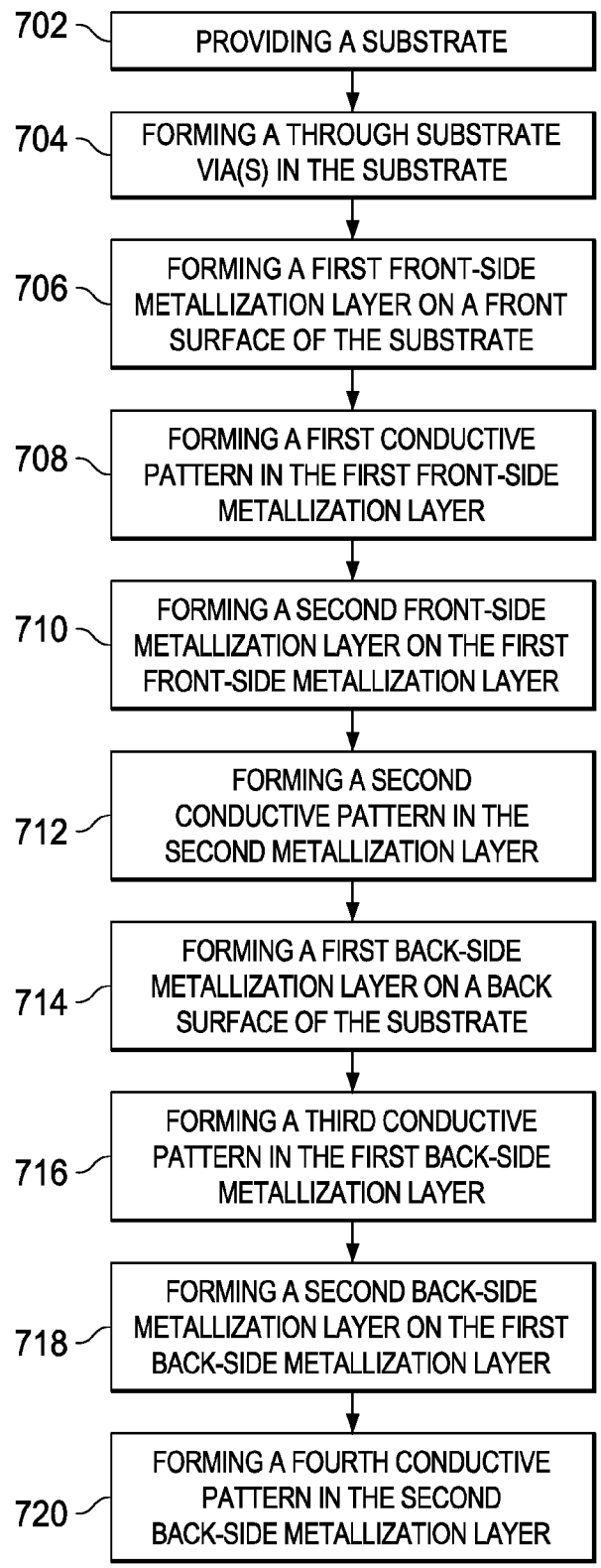
FIG. 8 is a method of forming the embodiments of FIGS. 6A through 7D according to an embodiment.

FIG. 8 is a method of forming the embodiments of FIGS. 6A through 6H and FIGS. 7A through 7D. The steps discussed with regard to FIG. 8 may be performed in any order, and any sequence discussed herein is only for clarification of the embodiment.

In step 702, a substrate is provided. This substrate may be a bulk silicon substrate or the like. In step 704, TSVs are formed in the substrate. For example, openings may be formed extending into the substrate by, for example, one or more etching processes, milling, laser techniques, or the like through a front surface of the substrate. The openings may be filled with a conductive material. The conductive material may comprise, for example, copper, tungsten, aluminum, silver, combinations thereof, or the like, formed by an electro-chemical plating process, thereby forming the through substrate vias.

In step 706, a first front-side metallization layer is formed on the front surface of the substrate. The first front-side metallization layer may be a dielectric, such as BPSG, silicon oxide, silicon nitride, silicon oxynitride, USG, or the like, and may be formed using a CVD technique. It should be noted that the front-side metallization layer may be formed adjoining the substrate, or other layers, such as other metallization layers, may be disposed between the substrate and the first front-side metallization layer. In step 708, a first conductive pattern, such as illustrated in FIG. 6E as the first conductive pattern 110 and contact pads 118 or in FIG. 7B as the first conductive pattern 210/216, is formed in the first front-side metallization layer. The pattern may be formed by using standard lithography and deposition techniques. A damascene or dual damascene process may be used. A photoresist may be formed over the metallization layer and patterned using a lithography mask. An etch may be used to form openings in the metallization layer. A conductive material may be deposited in the openings using, for example, a CVD technique. The conductive material may be copper, nickel, aluminum, tungsten, titanium, combinations thereof, and/or the like. Any excess conductive material may be removed and the metallization layer may be planarized using a CMP. A portion of the conductive material may be electrically coupled to a TSV formed in step 704.

In step 710, similar to step 706, a second front-side metallization layer is formed on the first front-side metallization layer. In step 712, similar to step 708, a second conductive pattern, such as illustrated in FIG. 6D as second conductive pattern 114 or in FIG. 7B as cross links 214 and 220, is formed in the second front-side metallization layer. Portions of the second conductive pattern in the second front-side metallization layer may electrically couple portions of the first conductive pattern in the first front-side metallization layer.

Other layers, such as more metallization layers, may be formed on the second front-side metallization layer. Further details of additional processing regarding the front-side of the substrate may be readily understood by a person having ordinary skill in the art and are therefore omitted herein.

In some instances, the back-side of the substrate may require thinning to expose the TSVs through the back surface. This may be accomplished using an etching and/or planarization process, such as a CMP process. For example, initially a CMP may be performed to initially expose a portion of the TSVs. Thereafter, one or more wet etching processes having a high etch rate selectivity may be performed, thereby leaving the TSVs protruding from the backside of the substrate.

In step 714, a first back-side metallization layer is formed on the back surface of the substrate. The first back-side metallization layer may be a dielectric, such as BPSG, silicon oxide, silicon nitride, silicon oxynitride, USG, or the like, and may be formed using a CVD technique. It should be noted that the first back-side metallization layer may be formed adjoining the substrate, or other layers, such as other metallization layers, may be disposed between the substrate and the first back-side metallization layer. In step 716, a third conductive pattern, such as illustrated in FIG. 6F as the third conductive pattern 112 and contact pads 120 or in FIG. 7C as the second conductive pattern 212/226, is formed in the first back-side metallization layer. The pattern may be formed by using standard lithography and deposition techniques. A damascene or dual damascene process may be used. A photoresist may be formed over the metallization layer and patterned using a lithography mask. An etch may be used to form openings in the metallization layer. A conductive material may be deposited in the openings using, for example, a CVD technique. The conductive material may be copper, nickel, aluminum, tungsten, titanium, combinations thereof, and/or the like. Any excess conductive material may be removed, and the metallization layer may be planarized using a CMP. A portion of the third conductive pattern may be electrically coupled to a TSV formed in step 704.

In step 718, similar to step 714, a second back-side metallization layer is formed on the first back-side metallization layer. In step 720, similar to step 716, a fourth conductive pattern, such as illustrated in FIG. 6G as the fourth conductive pattern 116 or in FIG. 7C as cross links 224 and 230, is formed in the second back-side metallization layer. Portions of the fourth conductive pattern in the second back-side metallization layer may electrically couple portions of the third conductive pattern in the first back-side metallization layer.

Other layers, such as more metallization layers, may be formed on the second back-side metallization layer. Further details of additional processing regarding the back-side of the substrate may be readily understood by a person having ordinary skill in the art, and therefore, such details are omitted herein.

Other embodiments contemplate a combination of features of FIGS. 2A through 3D and FIGS. 6A through 7D. Note that any layer or conductive pattern or other features that are described as formed in a particular metallization layer may be formed in any metallization layer, such as a metallization layer on either the first or second integrated circuit die 12 or 16 or a metallization layer on the interposer 14. Accordingly, any combination or selection of conductive bumps, TSVs, or vias may be used in forming the inductors and/or transformers. FIGS. 9A, 9B, 10A, and 10B briefly illustrate two further embodiments that combine some of these features.

Figure 9A:
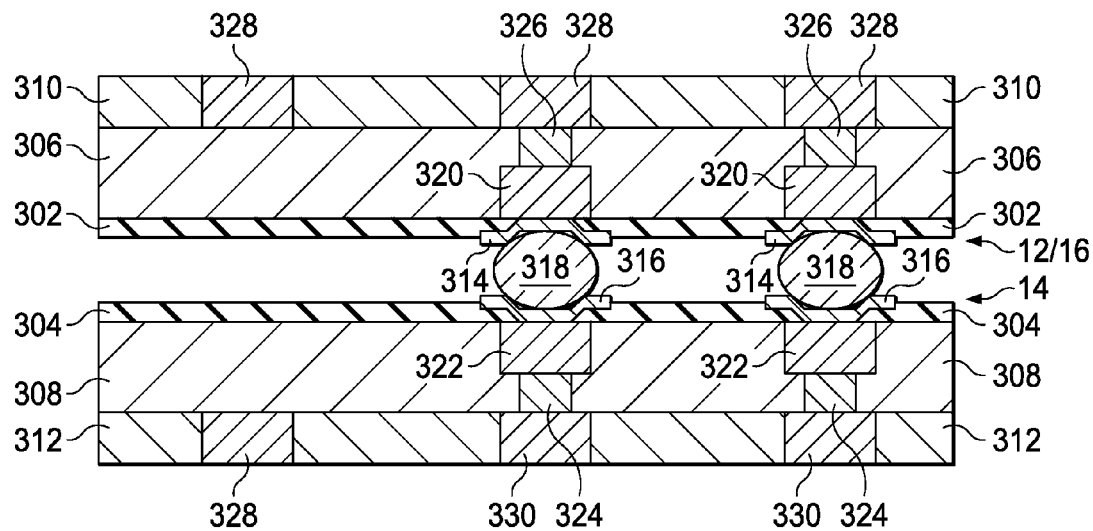
FIGS. 9A and 9B illustrate various views of a portion of a 3D structure in accordance with a yet another embodiment.
Figure 9B:
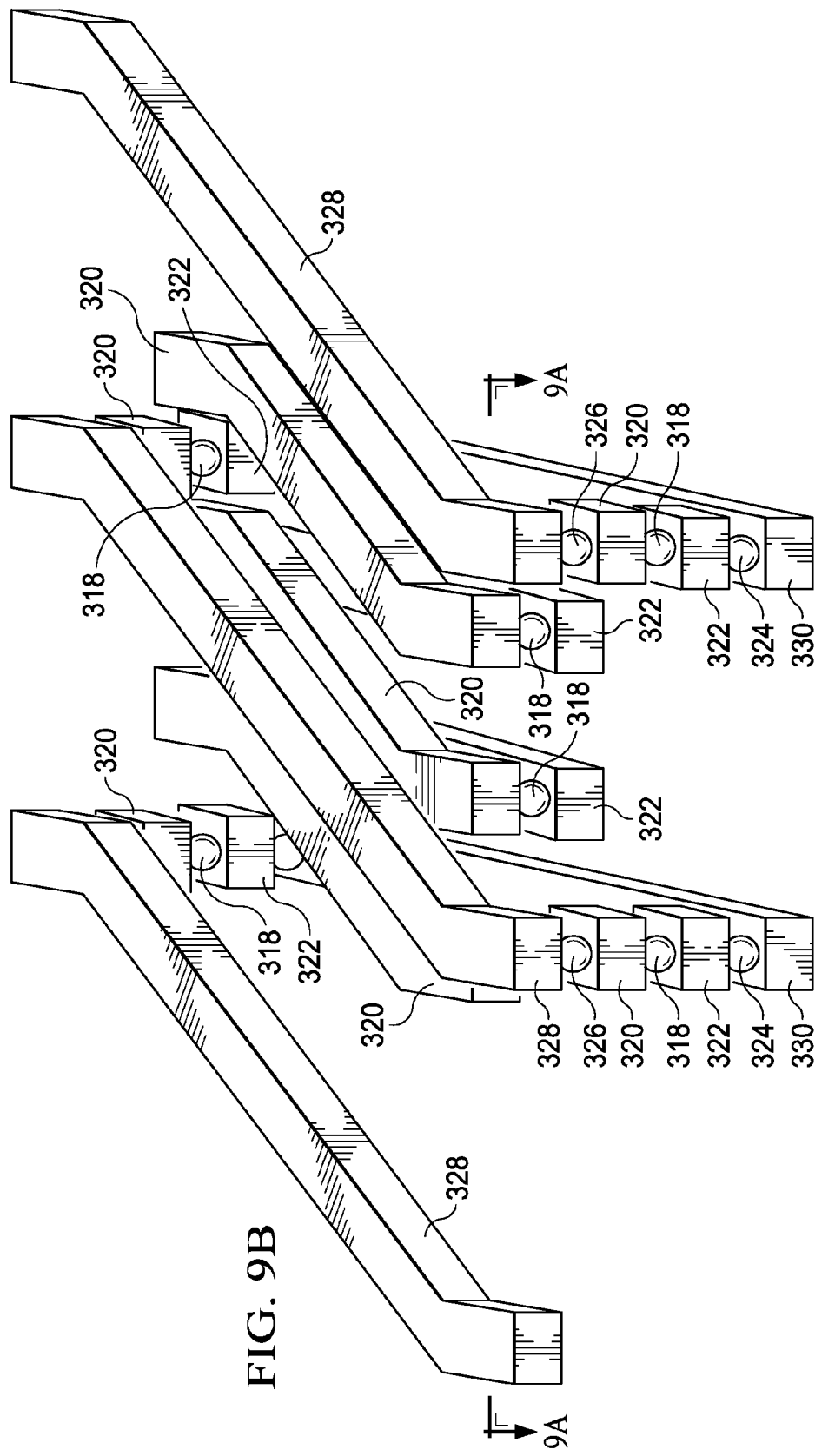

FIGS. 9A and 9B show another embodiment incorporating different features of the above embodiments and illustrate a structure using conductive bumps 318 to form an inductor and/or transformer. FIG. 9A is a cross section view, and FIG. 9B is a simplified 3D view. Line 9A-9A in FIG. 9B illustrates the cross section view in FIG. 9B. In integrated circuit die 12/16 is a first metallization layer 310, a second metallization layer 306 on the first metallization layer 310, and a passivation layer 302 on the second metallization layer 306. Underbump pads 314 contact portions of a first conductive pattern 320 in the second metallization layer 306. Vias 326 couple the portions of the first conductive pattern 320 to portions of a second conductive pattern 328 in the first metallization layer 310. In the interposer 14 is a first front-side metallization layer 312, a second front-side metallization layer 308 on the first front side metallization layer 312, and a passivation layer 304 on the second front-side metallization layer 308. Underbump pads 316 are formed to contact portions of a third conductive pattern 322 in the second front-side metallization layer 308. Vias 324 couple the portions of the third conductive pattern 322 to portions of a fourth conductive pattern 330 in the first front-side metallization layer 312. Conductive bumps 318 are physically and electrically coupled to the underbump pads 314 and 316.

Figure 10A:
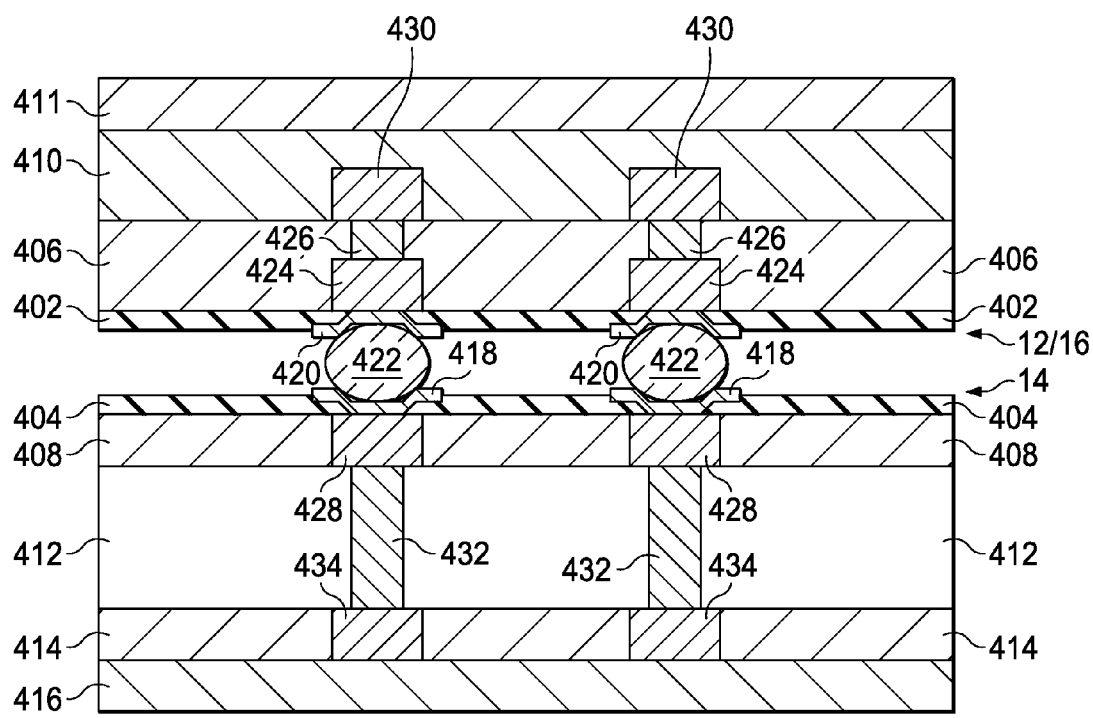
FIGS. 10A and 10B illustrate various views of a portion of a 3D structure accordance with a yet additional embodiment.
Figure 10B:
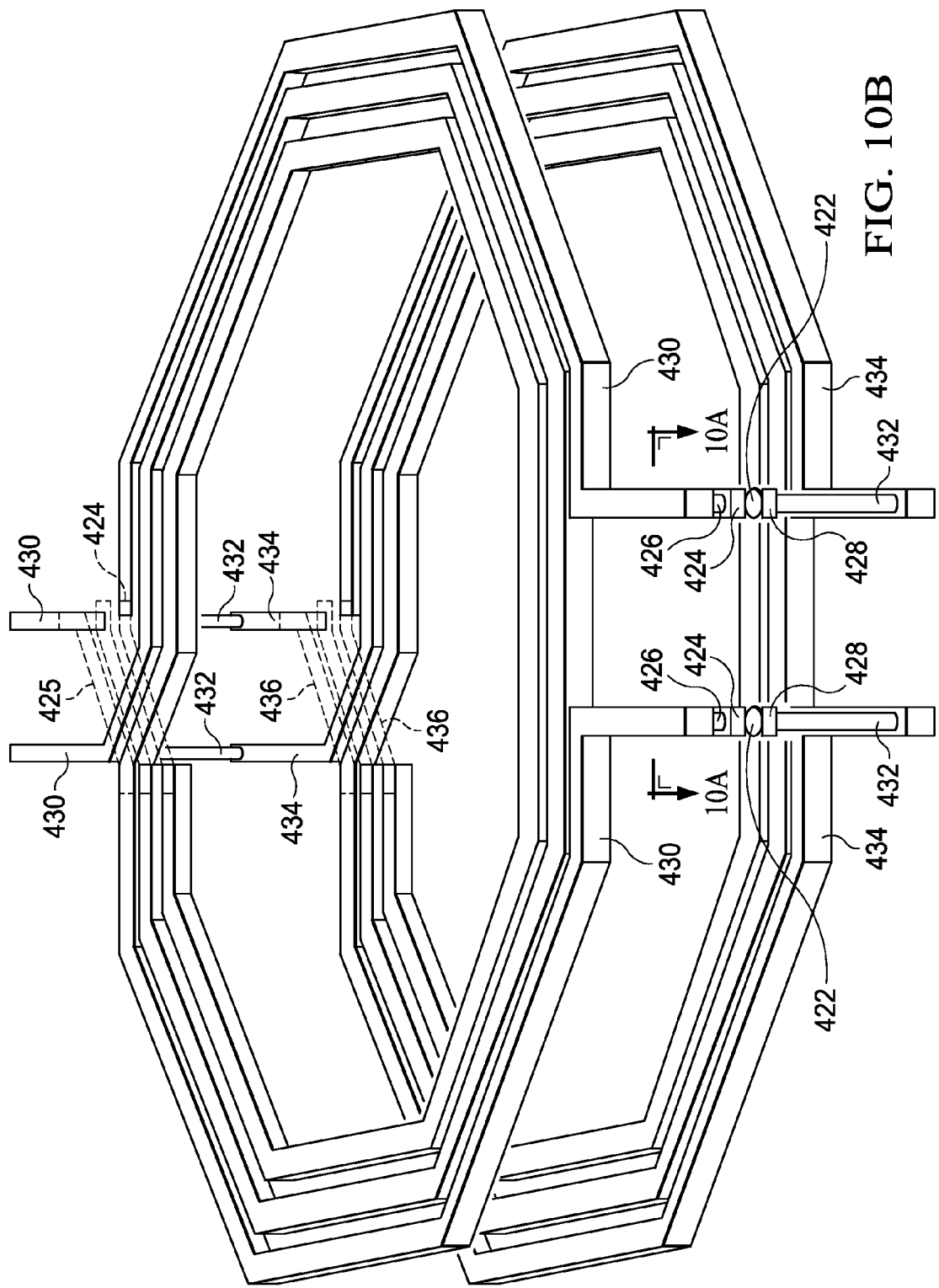

FIGS. 10A and 10B show an even further embodiment incorporating different features of the above embodiments and illustrate a structure using TSVs 432, vias 426, and conductive bumps 422 to form an inductor and/or transformer. FIG. 10A is a cross section view, and FIG. 10B is a simplified 3D view. Line 10A-10A in FIG. 10B illustrates the cross section view in FIG. 10B. In integrated circuit die 12/16 is a first metallization layer 411, a second metallization layer 410 on the first metallization layer 411, a third metallization layer 406 on the second metallization layer 410, and a passivation layer 402 on the third metallization layer 406. Underbump pads 420 are formed to couple contact pads 424 in the third metallization layer 406. Vias 426 couple contact pads 424 to portions of a first conductive pattern 430 in the second metallization layer 410. A second conductive pattern 425 is in the first metallization layer 411 coupled to portions of the first conductive pattern 430, as shown in FIG. 10B.

In the interposer 14 is a front-side metallization layer 408 on a front surface of a substrate 412, a passivation layer 404 on the front-side metallization layer 408, a first back-side metallization layer 414 on the back surface of the substrate 412, and a second back-side metallization layer 416 on the first back-side metallization layer 414. Underbump pads 418 are formed to couple contact pads 428 in the front-side metallization layer 408. TSVs 432 couple the contact pads 428 to portions of a third conductive pattern 434 in the first back-side metallization layer 414. A fourth conductive pattern 436 is in the second back-side metallization layer 414 coupled to portions of the third conductive pattern 434, as shown in FIG. 10B. Conductive bumps 422 are physically and electrically coupled to the underbump pads 418 and 420.

Figure 11A:
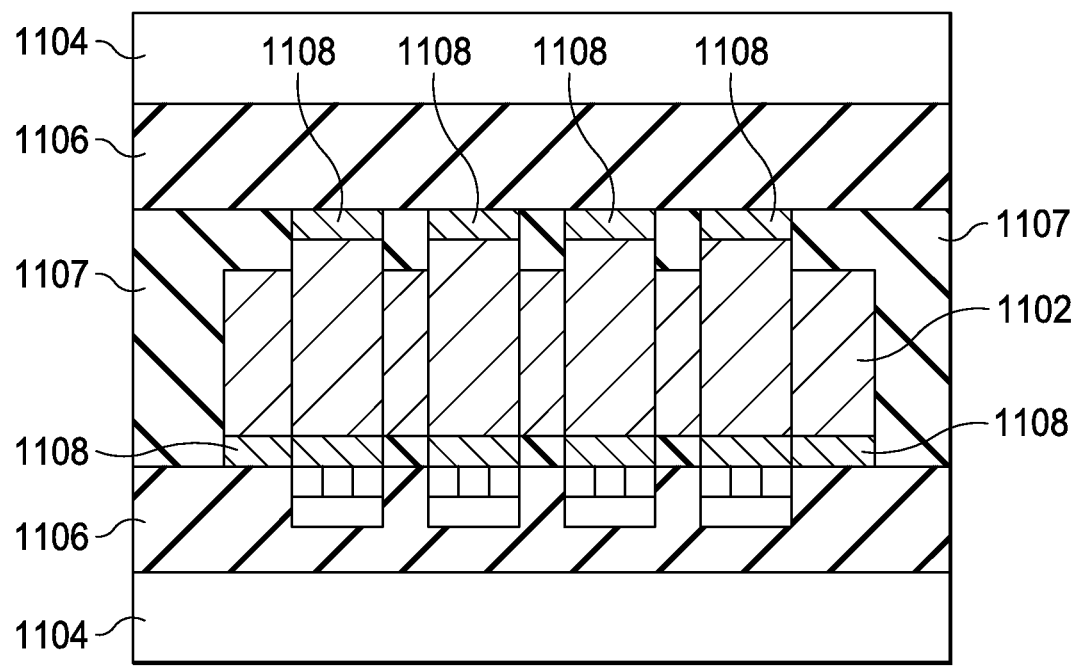
FIGS. 11A-11C illustrate various views of an inductor having a magnetic layer within the coil in accordance with a yet additional embodiment.
Figure 11B:
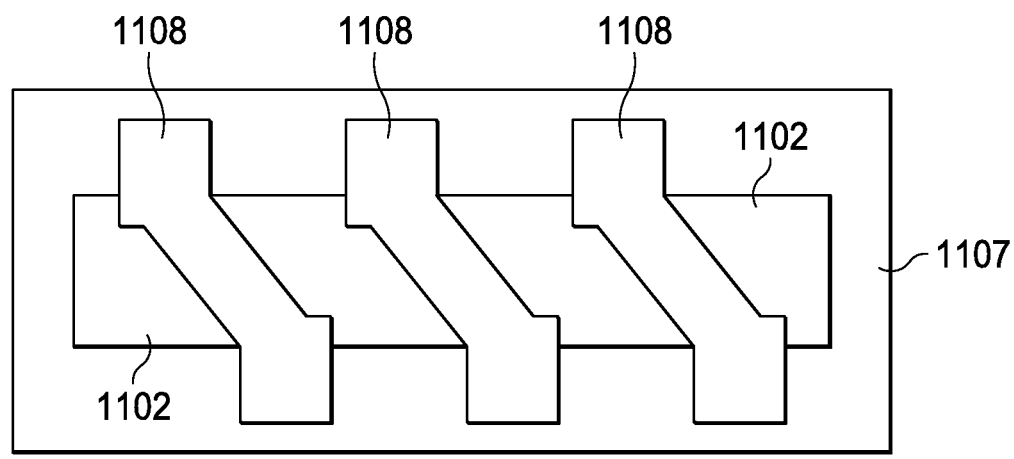
Figure 11C:
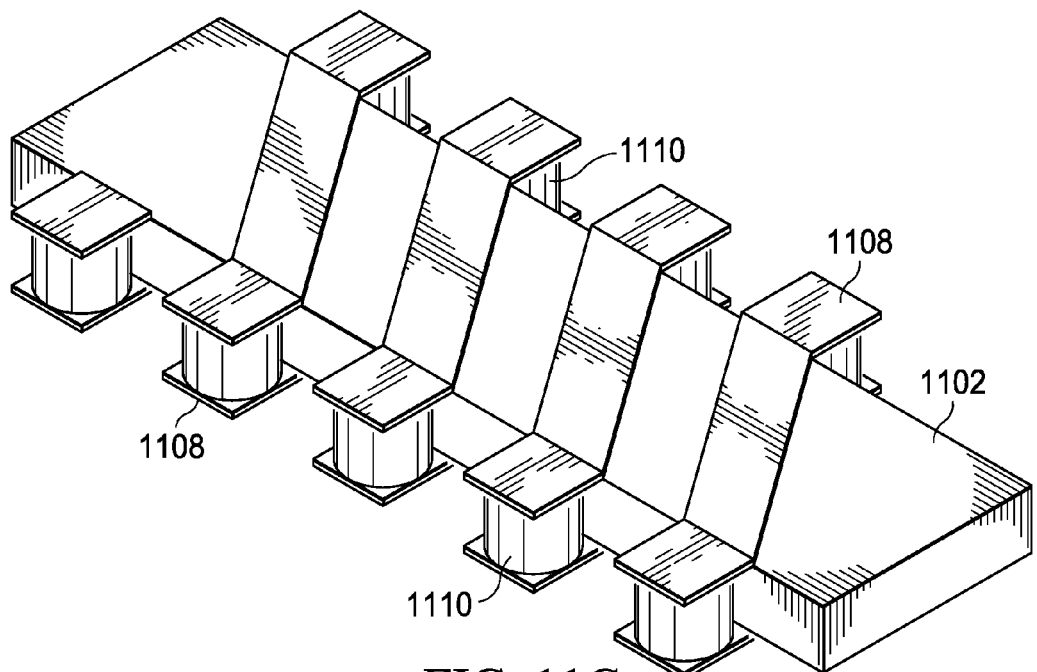

FIGS. 11A-11C illustrate an embodiment utilizing a magnetic layer 1102 interposed between different layers of a coil in accordance with an embodiment, wherein FIG. 11A is a cross-sectional view, FIG. 11B is a plan view, and FIG. 11C is a perspective view. For ease of illustration, not every layer or structural element is depicted in each of FIGS. 11A-11C. In other words, some features have been omitted in the Figures to better illustrate others. As shown in FIG. 11A, portions of an inductor pattern 1108 are formed on oxide layers 1106 formed on substrates 1104. The inductor patterns 1108 may include redistribution layers and cross-over patterns. An underfill material 1107 may be placed between the dies. Electrical connections 1110 (e.g., vias) may electrically couple the various inductor patterns 1108. In an embodiment, the magnetic layer 1102 has a thickness of, in some cases, between about 10 µm to about 40 µm.

It should be noted that FIGS. 11A-11C illustrate an embodiment in which a 3D inductor is formed across substrates, such as separate dies, a die and an interposer, or the like. In other embodiments, an inductor may be formed within a single substrate, such as a die, interposer, packaging substrate, or the like. In this embodiment, the various patterns of the conductors for the inductor are formed in one or more dielectric layers interconnected using vias. The magnetic layer 1102 is formed within the coil.

It should be noted that FIGS. 11A-11C illustrate coil type inductor configurations for illustrative purposes. Other embodiments may utilize different shapes of inductors, such as spirals and the like.

FIGS. 11A-11C illustrate the utilization of a magnetic layer 1102 in accordance with an embodiment. In an embodiment, the magnetic material 1102 may be replaced with a dielectric material. In an embodiment, the magnetic layer 1102 has a thickness of less than about 0.2 µm.

Figure 12A:
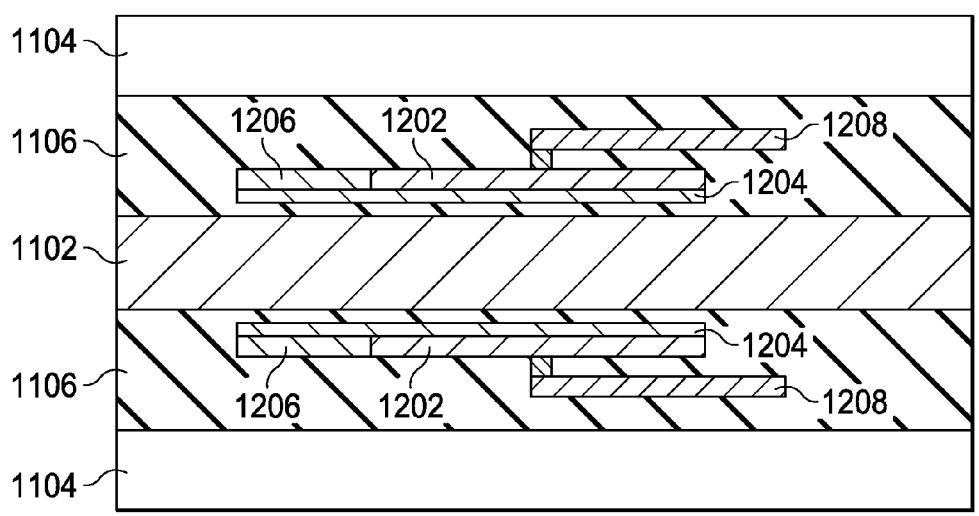
FIGS. 12A-12C illustrate various views of an inductor having a magnetic layer within the coil in accordance with a yet additional embodiment.
Figure 12B:
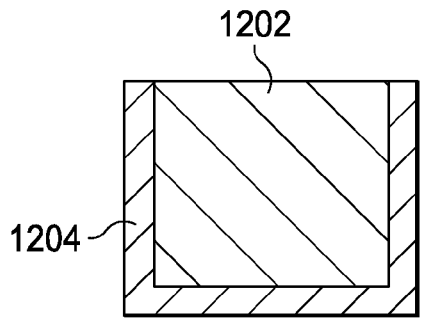
Figure 12C:
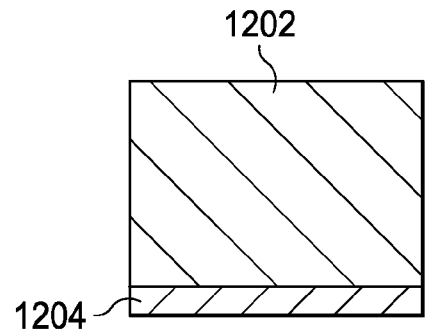

As illustrated in FIGS. 12A-12C, a conductive layer 1202, such as a copper, tungsten, aluminum, or the like, is formed with a magnetic layer 1204, such as iron, formed along one or more sides. FIG. 12A shows a leading metal 1206, which provides a conductive element to a port for signal injection, and a coil cross path 1208, which provides a conductive element to other structures and/or circuits of the inductor. In an embodiment, the conductive layer 1202 and the magnetic layer 1204 have a combined thickness of, in some cases, between about 4 µm to about 10 µm.

As shown in FIG. 12B, in an embodiment the magnetic layer 1204 is formed along the bottom and sidewalls of the conductive layer 1202. As shown in FIG. 12C, in an embodiment the magnetic layer 1204 is only formed along the bottom the conductive layer 1202.

Figure 13A:
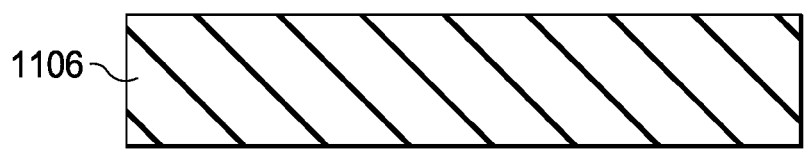
FIGS. 13A-13E illustrate an embodiment method of forming the magnetic layer on the bottom and sidewalls of the conductive layer.
Figure 13B:
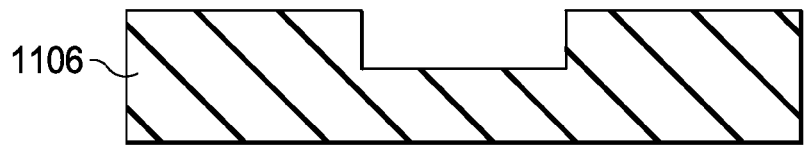
Figure 13C:
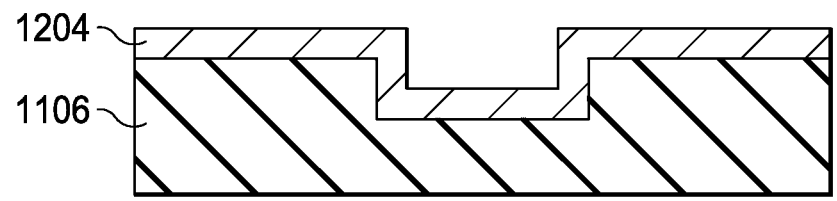
Figure 13D:
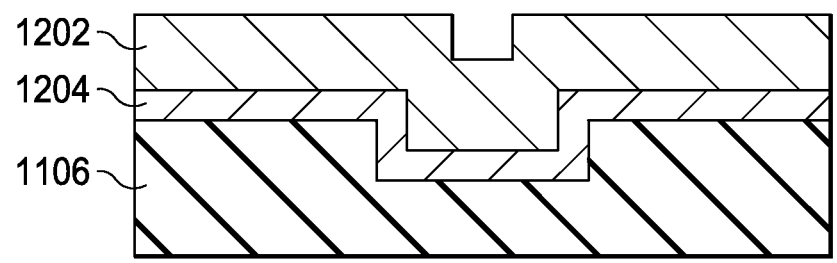
Figure 13E:
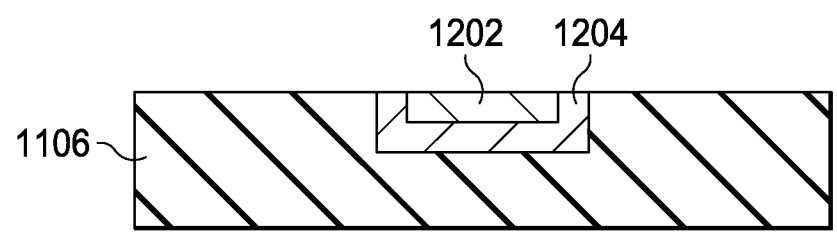

Referring now to FIGS. 13A-13E, an embodiment method of forming the magnetic layer 1204 on the bottom and sidewalls of the conductive layer 1202 is illustrated. In FIGS. 13A-13B, an etching process is performed to generate a cavity, channel, or similar structure in the oxide layer 1106. Thereafter, as shown in FIG. 13C, a sputtering process is performed to deposit the magnetic layer 1204 over the oxide layer 1106. Next, as shown in FIG. 13D, a plating process is performed to deposit the conductive layer 1202 over the magnetic layer 1204. Then, as shown in FIG. 13E, a chemical-mechanical polishing (CMP) process is performed to remove portions of the conductive layer 1202 outside the cavity. As shown in FIG. 13E, the magnetic layer 1204 is thereby formed on the bottom and sidewalls of the conductive layer 1202.

It is believed that the inductance of an inductor, such as a spiral, degrades as the size is shrunk. For example, a spiral may exhibit a 5% inductance degrade when having 0.95 shrink and 10% for 0.9 shrink.

Embodiments such as those disclosed above utilize, for example, a ubump RDL with magnetic material to improve inductance. Such a configuration allows the design to shrink and maintain the inductance with a thin magnetic layer, many times without changing the layout. Additionally, embodiments such as those disclosed above provide increased inductance density.

The ubump RDL with magnetic material is located in between dies or in the passivation layers, which is separated from substrate by a plurality of dielectric layers.

Other embodiments may be used to form, for example, MOSFET, MOSVAR, or MOMCAP MIMCAP, etc.

In an embodiment, a method of forming a semiconductor device is provided. The method includes receiving a semiconductor die comprising a first substrate and a first dielectric layer over the first substrate, the first dielectric layer having a first conductive pattern, and receiving an interposer comprising a second substrate and a second dielectric layer over the second substrate, the second dielectric layer having a second conductive pattern. A magnetic layer is formed on at least one of the interposer and the semiconductor die. The semiconductor die is bonded to the interposer using conductive bumps, wherein at least one of the conductive bumps electrically couples the first conductive pattern to the second conductive pattern to form a coil, and wherein the magnetic layer is interposed between the first conductive pattern and the second conductive pattern after the bonding.

In another embodiment, a method of forming a semiconductor device is provided. The method includes forming a first layer on a first substrate, the first layer including a first conductive pattern, the first conductive pattern forming a first portion of a coil. A first magnetic layer on the first layer, and a second layer is formed on a second substrate, the second layer comprising a second conductive pattern, the second conductive pattern forming a second portion of the coil. The first conductive pattern is electrically coupled to the second conductive pattern such that the magnetic layer is interposed between the first conductive pattern and the second conductive pattern, the electrically coupling forming the coil from the first portion and the second portion.

In yet another embodiment, a method of forming a semiconductor device is provided. The method includes forming through vias (TVs) extending through a substrate and forming a first metallization layer on a first side of the substrate, the first metallization layer comprising a first conductive pattern. A second metallization layer is formed on a second side of the substrate, the second metallization layer comprising a second conductive pattern, wherein the TVs comprise first TVs electrically coupling the first conductive pattern to the second conductive pattern to form a first coil. A magnetic layer is formed such that at least a portion of the magnetic layer is interposed between the first conductive pattern and the second conductive pattern.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for forming a semiconductor device, the method comprising:
    receiving a device comprising a first substrate and a first dielectric layer over the first substrate, the first dielectric layer having a first conductive pattern;
    receiving an interposer comprising a second substrate and a second dielectric layer over the second substrate, the second dielectric layer having a second conductive pattern;
    forming a first magnetic layer on at least one of the interposer and the device;
    forming a second magnetic layer on at least one of the interposer and the device, the second magnetic layer being a different layer than the first magnetic layer; and
    bonding the device to the interposer using conductive bumps, wherein at least one of the conductive bumps electrically couples the first conductive pattern to the second conductive pattern to form a coil, and wherein the first magnetic layer and the second magnetic layer are interposed between the first conductive pattern and the second conductive pattern after the bonding.

2. The method of claim 1, further comprising forming a through substrate via (TSV) extending through the second substrate, the TSV being electrically coupled to the second conductive pattern.

3. The method of claim 1, wherein the first conductive pattern comprises at least two trace links extending in a first direction, and the second conductive pattern comprises at least two trace links extending in a second direction different from the first direction.

4. The method of claim 1, wherein the first conductive pattern and the second conductive pattern each comprises a ring-shape.

5. The method of claim 1, wherein the first magnetic layer is in contact with one of the first conductive pattern and the second conductive pattern.

6. The method of claim 1, wherein the first magnetic layer is formed on one or more sides of a conductor of the coil.

7. The method of claim 1, wherein the first magnetic layer is in contact with the first conductive pattern and the second magnetic layer is in contact with the second conductive pattern.

8. The method of claim 7, further comprising a third magnetic layer interposed between the first magnetic layer and the second magnetic layer.

9. A method for forming a semiconductor device, the method comprising:
    forming a first layer on a first substrate, the first layer comprising a first conductive pattern, the first conductive pattern forming a first portion of a coil;
    forming a first patterned magnetic layer on the first conductive pattern, the first patterned magnetic layer having a pattern of the first conductive pattern;
    forming a second layer on a second substrate, the second layer comprising a second conductive pattern, the second conductive pattern forming a second portion of the coil; and
    electrically coupling the first conductive pattern to the second conductive pattern such that the first patterned magnetic layer is interposed between the first conductive pattern and the second conductive pattern, the electrically coupling forming the coil from the first portion and the second portion.

10. The method of claim 9, wherein the coil spirals around the first patterned magnetic layer.

11. The method of claim 10, further comprising forming a second patterned magnetic layer on the second conductive pattern, the second patterned magnetic layer having a pattern of the second conductive pattern.

12. The method of claim 11, wherein the second patterned magnetic layer extends along sidewalls of the second conductive pattern.

13. The method of claim 9, wherein the first patterned magnetic layer extends along sidewalls of the first conductive pattern.

14. The method of claim 9, wherein the first patterned magnetic layer directly contacts the first conductive pattern.

15. The method of claim 9, wherein the electrically coupling comprises forming solder bumps to electrically couple the first conductive pattern to the second conductive pattern.

16. The method of claim 9, wherein the first patterned magnetic layer physically contacts the first conductive pattern.

17. The method of claim 9, wherein the first patterned magnetic layer is interposed between adjacent traces of the first conductive pattern.

18. A method for forming a semiconductor device, the method comprising:
   forming a first conductive pattern on a first substrate;
   forming a magnetic layer on the first conductive pattern;
   forming a second conductive pattern on a second substrate; and
   electrically coupling the first conductive pattern to the second conductive pattern, the first conductive pattern and the second conductive pattern forming a coil, wherein the magnetic layer is in direct physical contact with one of the first conductive pattern and the second conductive pattern.

19. The method of claim 18, wherein the magnetic layer is formed on one or more sides of a first conductive pattern.

20. The method of claim 18, wherein the first conductive pattern has a ring shape in a plan view.

\* \* \* \* \*